US012080744B2

(12) United States Patent
Lee et al.

(10) Patent No.: US 12,080,744 B2
(45) Date of Patent: Sep. 3, 2024

(54) IMAGE SENSOR

(71) Applicant: SAMSUNG ELECTRONICS CO., LTD., Suwon-si (KR)

(72) Inventors: Dong-Chul Lee, Hwaseong-si (KR); Beomsuk Lee, Seoul (KR); Minho Jang, Suwon-si (KR); Kwansik Cho, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 644 days.

(21) Appl. No.: 17/377,792

(22) Filed: Jul. 16, 2021

(65) Prior Publication Data

US 2022/0149101 A1 May 12, 2022

(30) Foreign Application Priority Data

Nov. 11, 2020 (KR) ........................ 10-2020-0150229

(51) Int. Cl.
*H01L 27/146* (2006.01)

(52) U.S. Cl.
CPC .. *H01L 27/14636* (2013.01); *H01L 27/14623* (2013.01); *H01L 27/1463* (2013.01); *H01L 27/1464* (2013.01)

(58) Field of Classification Search
CPC ......... H01L 27/14636; H01L 27/14623; H01L 27/1463; H01L 27/1464; H01L 27/14634; H01L 27/14643; H01L 24/05; H01L 25/0657; H01L 27/1461; H01L 27/14612
See application file for complete search history.

(56) References Cited

U.S. PATENT DOCUMENTS

| | | | | |
|---|---|---|---|---|
| 9,160,949 | B2 | 10/2015 | Zhang et al. | |
| 9,524,995 | B2 | 12/2016 | Koo et al. | |
| 10,304,887 | B2 | 5/2019 | Kim et al. | |
| 2010/0244173 | A1* | 9/2010 | Wang | H01L 27/1464 257/435 |
| 2014/0217486 | A1* | 8/2014 | Akiyama | H01L 27/14627 438/69 |
| 2020/0098798 | A1 | 3/2020 | Takahashi et al. | |
| 2021/0335862 | A1 | 10/2021 | Lee et al. | |

FOREIGN PATENT DOCUMENTS

| | | | |
|---|---|---|---|
| KR | 10-2020-0035821 | A | 4/2020 |
| KR | 10-2021-0130868 | A | 11/2021 |

* cited by examiner

*Primary Examiner* — Yara B Green
*Assistant Examiner* — William Serrano-Garcia
(74) *Attorney, Agent, or Firm* — Sughrue Mion, PLLC

(57) ABSTRACT

An image sensor includes a first chip including a pixel region, a pad region, and an optical black region interposed between the pixel region and the pad region, and a second chip being in contact with a first surface of the first chip and including circuits for driving the first chip. The first chip includes a first substrate, a device isolation portion disposed in the first substrate and defining unit pixels, an interlayer insulating layer interposed between the first substrate and the second chip, a connection wiring structure disposed in the interlayer insulating layer, and a connection contact plug disposed in the interlayer insulating layer and connecting the connection wiring structure to the device isolation portion in the optical black region. The image sensor further includes a conductive pad disposed in the first chip or the second chip.

20 Claims, 19 Drawing Sheets

IMAGE SENSOR

CROSS-REFERENCE TO RELATED APPLICATION

This application is based on and claims priority under 35 U.S.C. § 119 to Korean Patent Application No. 10-2020-0150229, filed on Nov. 11, 2020, in the Korean Intellectual Property Office, the disclosure of which is incorporated by reference herein in its entirety.

BACKGROUND

The disclosure relates to an image sensor.

Image sensors are semiconductor devices for converting optical images into electrical signals. Image sensors may be categorized as any one of charge coupled device (CCD) image sensors and complementary metal-oxide-semiconductor (CMOS) image sensors. CIS is short for the CMOS image sensor. The CIS may include a plurality of pixels two-dimensionally arranged. Each of the pixels may include a photodiode (PD). The photodiode may convert incident light into an electrical signal.

SUMMARY

Provided is an image sensor capable of reducing or minimizing a defect and of simplifying a manufacturing process.

Additional aspects will be set forth in part in the description that follows and, in part, will be apparent from the description, or may be learned by practice of presented embodiments.

In accordance with an aspect of the disclosure, an image sensor includes a first chip including a pixel region, a pad region, and an optical black region interposed between the pixel region and the pad region, and a second chip being in contact with a first surface of the first chip and including circuits for driving the first chip. The first chip includes a first substrate, a device isolation portion disposed in the first substrate and defining unit pixels, an interlayer insulating layer interposed between the first substrate and the second chip, a connection wiring structure disposed in the interlayer insulating layer, and a connection contact plug disposed in the interlayer insulating layer and connecting the connection wiring structure to the device isolation portion in the optical black region. The image sensor further includes a conductive pad disposed in the first chip or the second chip and being exposed in the pad region by a recess region penetrating the first substrate and the interlayer insulating layer, the conductive pad being electrically connected to the device isolation portion through the connection wiring structure and the connection contact plug.

In accordance with an aspect of the disclosure, an image sensor includes a first chip including a pixel region, a pad region, and an optical black region interposed between the pixel region and the pad region. And a second chip being in contact with a first surface of the first chip and including circuits for driving the first chip. The first chip includes a first substrate, a device isolation portion disposed in the first substrate and defining unit pixels, an interlayer insulating layer interposed between the first substrate and the second chip, a connection wiring structure disposed in the interlayer insulating layer of the optical black region and having a ring shape surrounding the pixel region in a plan view, connection contact plugs disposed in the interlayer insulating layer and connecting the connection wiring structure to the device isolation portion in the optical black region, and a conductive pad disposed in the interlayer insulating layer and being exposed in the pad region by a recess region penetrating the first substrate, the conductive pad being electrically connected to the device isolation portion through the connection wiring structure and the connection contact plugs. The connection contact plugs are connected in common to the conductive pad.

In accordance with an aspect of the disclosure, an image sensor includes a first chip including a pixel region, a pad region, and an optical black region interposed between the pixel region and the pad region, and a second chip being in contact with a first surface of the first chip and including circuits for driving the first chip. The first chip includes a first substrate, a device isolation portion disposed in the first substrate and defining unit pixels, photoelectric conversion portions disposed in the first substrate in the unit pixels, respectively, transfer gates disposed on the first substrate, an upper interlayer insulating layer interposed between the first substrate and the second chip, first wiring lines disposed in the upper interlayer insulating layer and including at least one connection wiring line constituting a connection wiring structure in the optical black region, a connection contact plug disposed in the upper interlayer insulating layer and connecting the connection wiring structure to the device isolation portion in the optical black region, upper connection pads exposed by the upper interlayer insulating layer, and metal patterns interposed between the second chip and the first wiring lines and including a conductive pad disposed in the pad region, and a first metal pattern disposed in the pixel region. The second chip includes a second substrate, second wiring lines disposed on the second substrate, and lower connection pads connected to the upper connection pads. The conductive pad is exposed in the pad region by a recess region penetrating the first substrate and the upper interlayer insulating layer, the conductive pad being electrically connected to the device isolation portion through the connection wiring structure and the connection contact plug.

BRIEF DESCRIPTION OF THE DRAWINGS

The above and other aspects, features, and advantages of embodiments of the disclosure will be more apparent from the following description taken in conjunction with the accompanying drawings.

DETAILED DESCRIPTION

Hereinafter, embodiments will be described in more detail with reference to the accompanying drawings.

Figure 1:
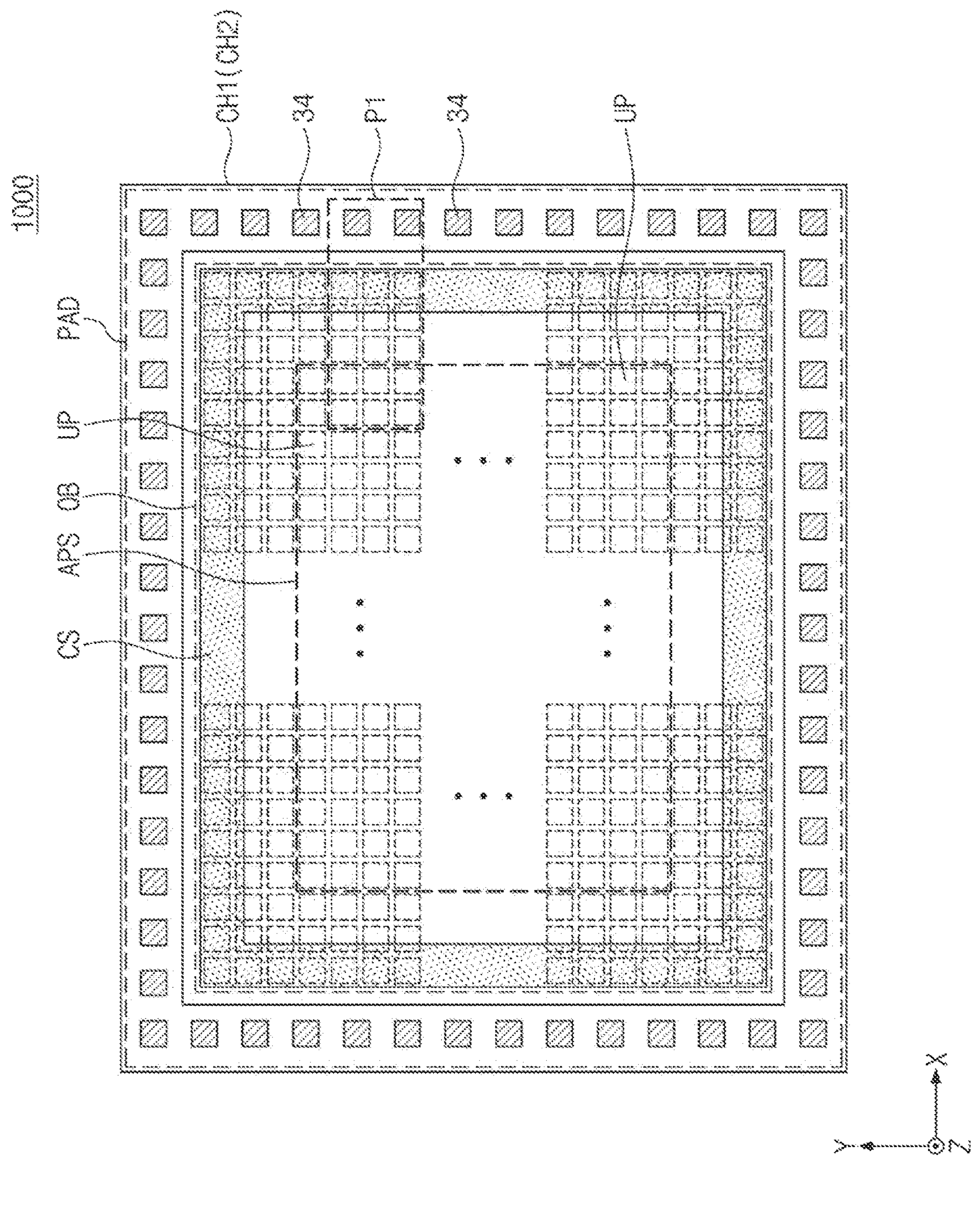
FIG. 1 is a plan view of an image sensor according to an embodiment.
Figure 2:
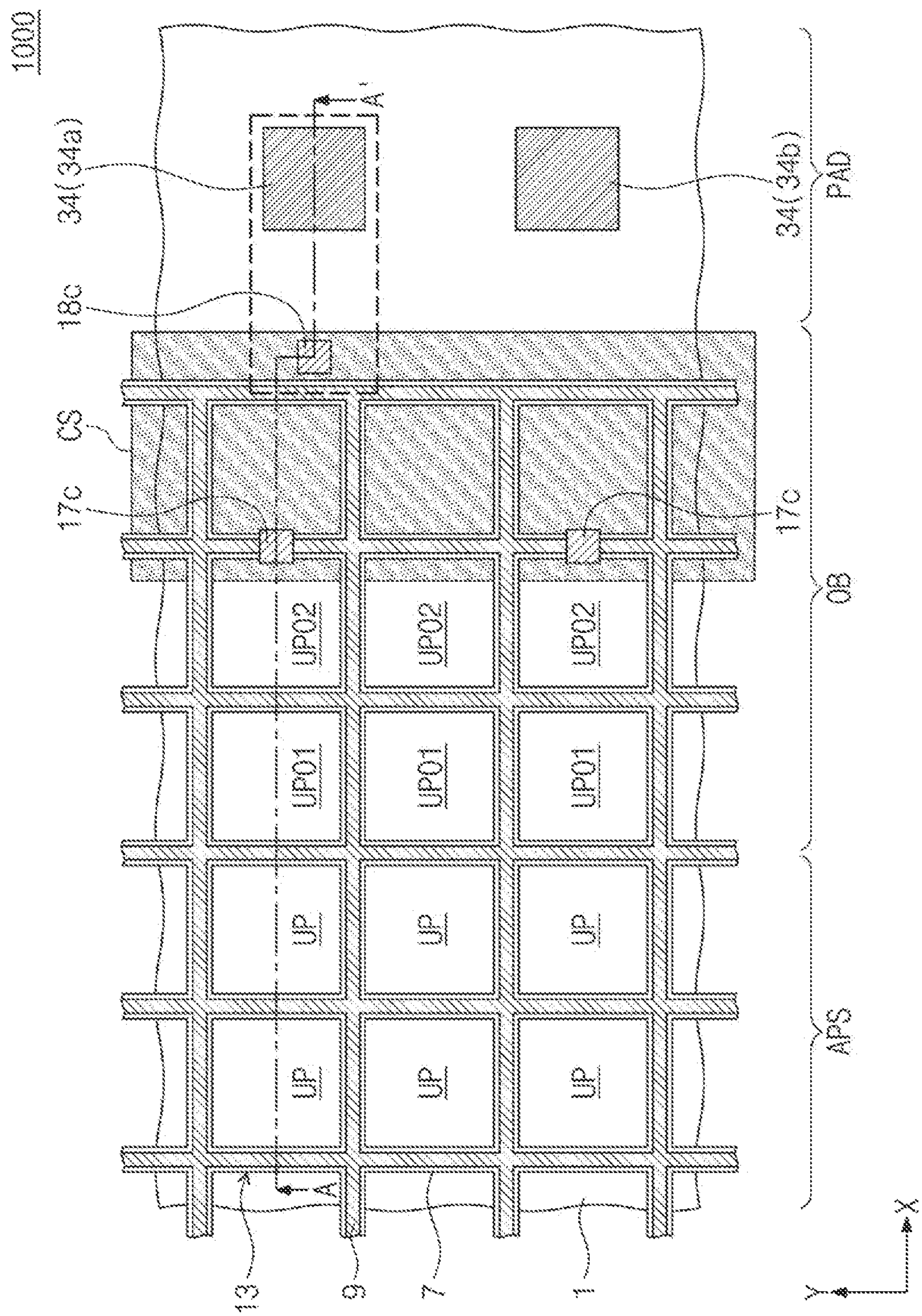
FIG. 2 is an enlarged view of a region 'P1' of FIG. 1.
Figure 3:
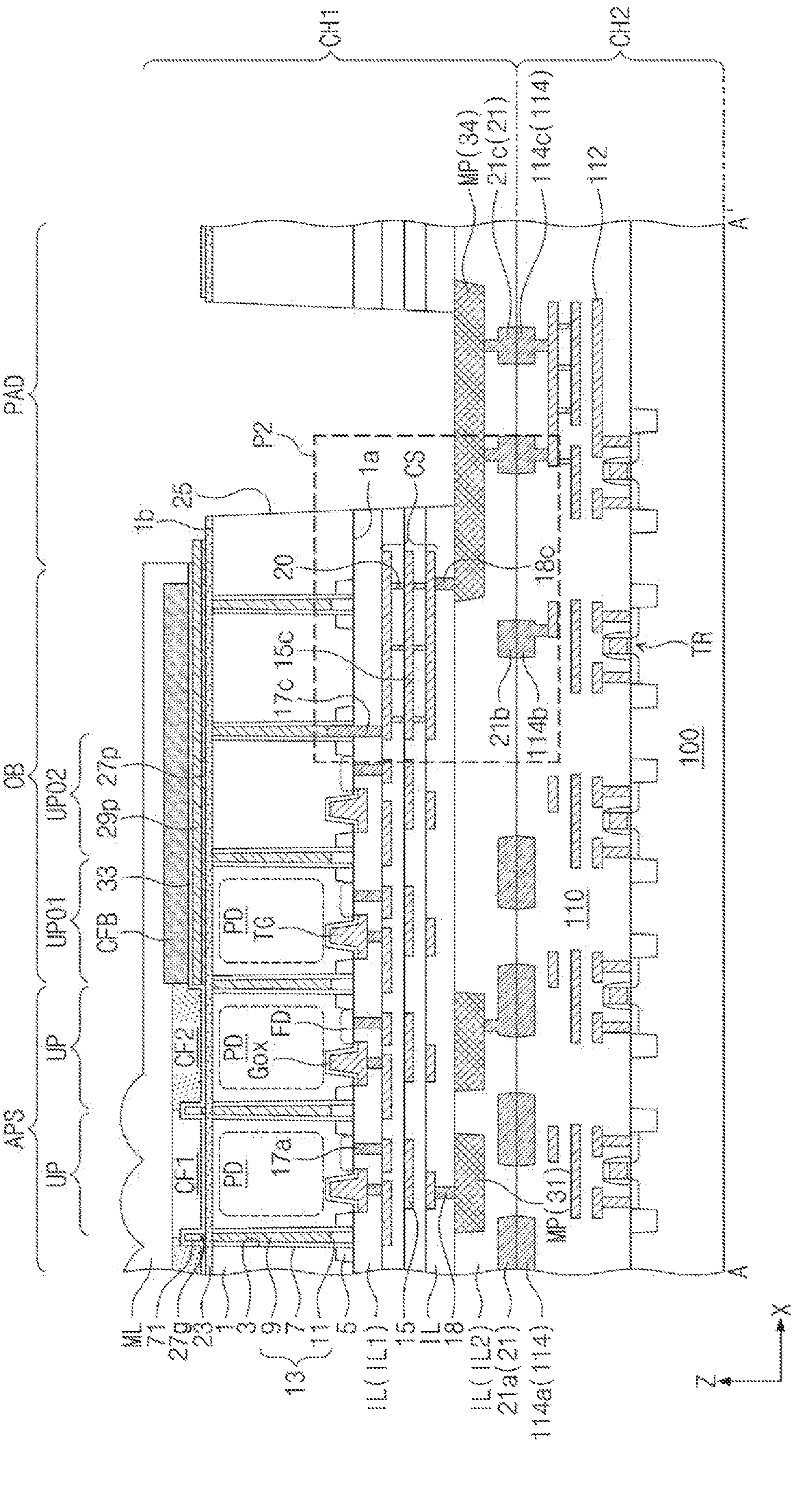
FIG. 3 is a cross-sectional view taken along a line A-A' of FIG. 2.
Figure 4:
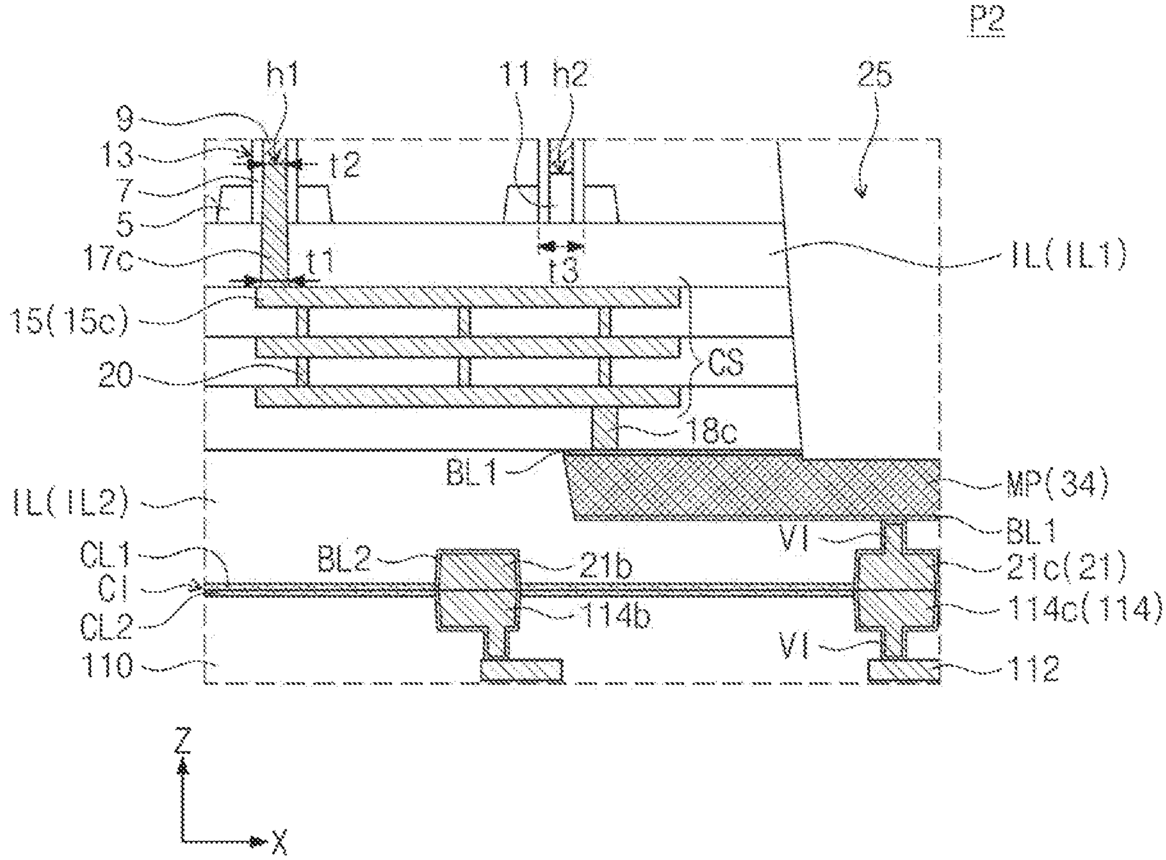
FIGS. 4 and 5 are enlarged views of a region 'P2' of FIG. 3 according to embodiments.
Figure 5:
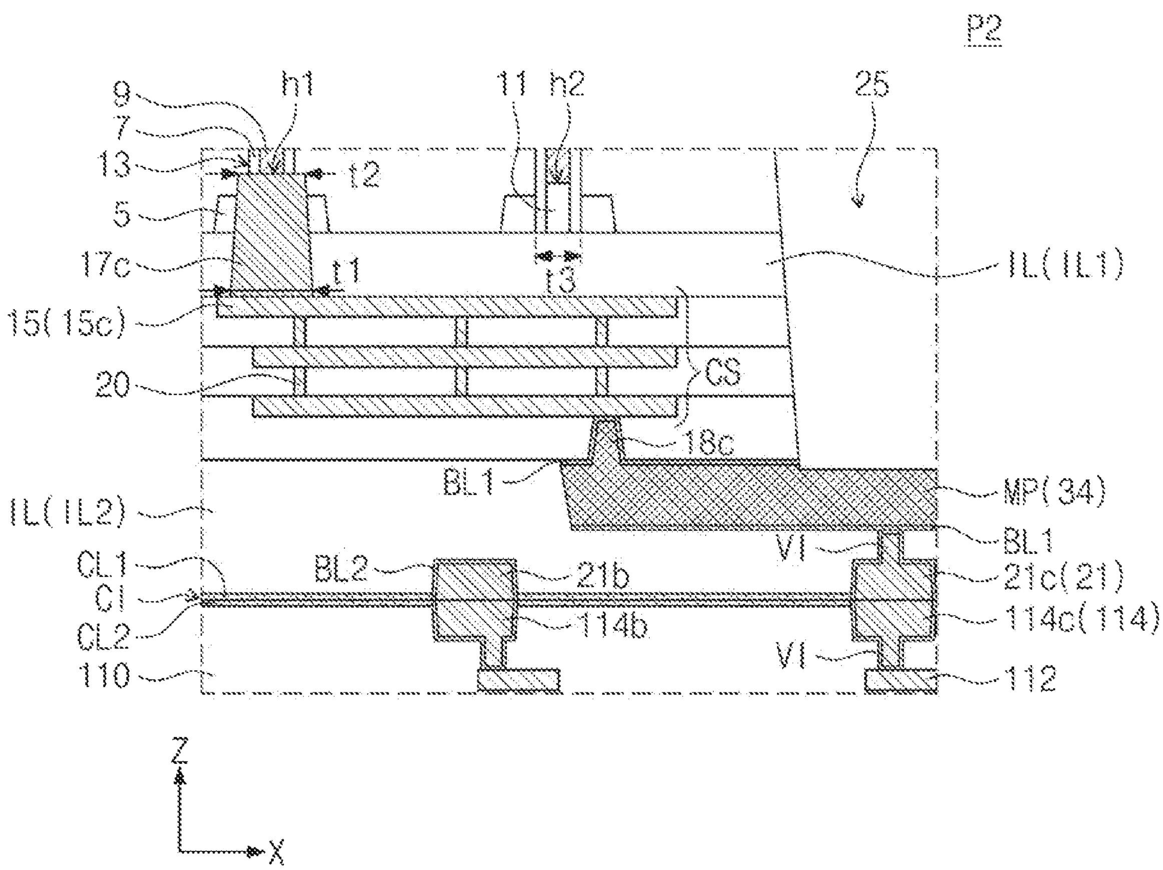

FIG. 1 is a plan view of an image sensor 1000 according to an embodiment. FIG. 2 is an enlarged view of a region 'P1' of FIG. 1. FIG. 3 is a cross-sectional view taken along a line A-A' of FIG. 2. FIGS. 4 and 5 are enlarged views of a region 'P2' of FIG. 3 according to embodiments.

Referring to FIGS. 1 to 3, the image sensor 1000 according to the present embodiments may have a structure in which a first chip CH1 and a second chip CH2 are bonded to each other. The first chip CH1 may perform an image sensing function. The second chip CH2 may include circuits for driving the first chip CH1 and/or for processing and storing electrical signals generated from the first chip CH1.

The first chip CH1 may include a first substrate 1 including a pad region PAD, an optical black region OB, and a pixel region APS. The optical black region OB and the pad region PAD may be disposed at least one side of the pixel region APS. For example, each of the optical black region OB and the pad region PAD may surround the pixel region APS when viewed in a plan view. The optical black region OB may be disposed between the pad region PAD and the pixel region APS. The first substrate 1 may include a first surface 1*a* and a second surface 1*b* that are opposite to each other. For example, the first substrate 1 may be a single-crystalline silicon wafer, a silicon epitaxial layer, or a silicon-on-insulator (SOI) substrate. The first substrate 1 may be doped with dopants of a first conductivity type. For example, the first conductivity type may be a P-type.

The pixel region APS may include a plurality of unit pixels UP two-dimensionally arranged in a first direction X and a second direction Y. In the pixel region APS, a deep device isolation portion 13 may be disposed in the first substrate 1 to isolate the unit pixels UP from each other. The deep device isolation portion 13 may extend into the optical black region OB. A shallow device isolation portion 5 may be disposed adjacent to the first surface 1*a* in the first substrate 1. The deep device isolation portion 13 may penetrate the shallow device isolation portion 5.

The deep device isolation portion 13 may include a conductive pattern 9 disposed in a deep trench 3, an isolation insulating layer 7 surrounding a sidewall of the conductive pattern 9, and a filling insulation pattern 11 disposed between the conductive pattern 9 and the first surface 1*a* of the first substrate 1. The conductive pattern 9 may include a conductive material, for example, a metal or poly-silicon doped with dopants. The isolation insulating layer 7 may include, for example, a silicon oxide layer. The filling insulation pattern 11 may include, for example, a silicon oxide layer. As illustrated in FIG. 2, the conductive pattern 9 of the deep device isolation portion 13 may have a lattice or grid shape and may be connected to a connection contact plug 17*c* to be described later.

A photoelectric conversion portion PD may be disposed in the first substrate 1 in each of the unit pixels UP. A photoelectric conversion portion PD may also be disposed in the first substrate 1 in the optical black region OB. For example, the photoelectric conversion portion PD may be doped with dopants of a second conductivity type opposite to the first conductivity type. The second conductivity type may be, for example, an N-type. The N-type dopants included in the photoelectric conversion portion PD may form a PN junction with the P-type dopants included in the first substrate 1 adjacent to the photoelectric conversion portion PD, and thus a photodiode may be provided.

In each of the unit pixels UP, a transfer gate TG may be disposed on the first surface 1*a* of the first substrate 1. A portion of the transfer gate TG may extend into the first substrate 1. A gate insulating layer Gox may be disposed between the transfer gate TG and the first substrate 1. A floating diffusion region FD may be disposed in the first substrate 1 at a side of the transfer gate TG. For example, the floating diffusion region FD may be a region doped with dopants of the second conductivity type.

Light may be incident into the first substrate 1 through the second surface 1*b* of the first substrate 1. Electron-hole pairs (EHPs) may be generated in a depletion region of the PN junction by the incident light. The generated electrons may move into the photoelectric conversion portion PD. When a voltage is applied to the transfer gate TG, the electrons may be moved into the floating diffusion region FD.

The first surface 1*a* may be covered with upper interlayer insulating layers IL. Each of the upper interlayer insulating layers IL may include any one or any combination of a silicon oxide layer, a silicon nitride layer, a silicon oxynitride layer, or a porous low-k dielectric layer. First wiring lines 15 may be disposed between or in the upper interlayer insulating layers IL. For example, the first wiring lines 15 may include a metal such as copper. The first wiring lines 15 may be connected to each other by intermediate contacts 20 disposed in the upper interlayer insulating layers IL. The first wiring lines 15 may include connection wiring lines 15*c* provided in the optical black region OB. The connection wiring lines 15*c* and intermediate contacts 20 therebetween may constitute a connection wiring structure CS. The connection wiring structure CS may include a plurality of the connection wiring lines 15*c*. Alternatively, the connection wiring structure CS may include a single connection wiring line 15*c*.

The connection wiring structure CS may surround the pixel region APS, as illustrated in FIG. 1. For example, the connection wiring structure CS may have a ring shape or a closed loop shape when viewed in a plan view. For example, a single connection wiring line 15*c* may have a ring shape, or a plurality of the connection wiring lines 15*c* connected to each other by the intermediate contacts 20 may have a ring shape. For example, a single connection wiring line 15*c* may have a ring shape, or a plurality of the connection wiring lines 15*c* may be connected to each other to form a ring shape. Alternatively, the connection wiring structure CS may have a bar shape when viewed in a plan view.

First contact plugs 17*a* may be provided in a first interlayer insulating layer IL1 of the upper interlayer insulating layers IL. The first contact plugs 17*a* may penetrate the first interlayer insulating layer IL1 to be connected to transistors provided on the first surface 1*a* of the first substrate 1 in the pixel region APS. For example, each of the first contact plugs 17*a* may be connected to the floating diffusion region FD or the transfer gate TG.

In the optical black region OB, a connection contact plug 17*c* may penetrate the first interlayer insulating layer IL1 to be connected to the deep device isolation portion 13. As illustrated in FIGS. 4 and 5, the connection contact plug 17*c* may penetrate the filling insulation pattern 11 to be connected to the conductive pattern 9. For example, a height h1 of a top surface of the connection contact plug 17*c* may be higher than a height h2 of a top surface of the filling insulation pattern 11. A width t1 of a bottom surface of the connection contact plug 17*c* may be greater than a width t2 of the top surface of the connection contact plug 17*c*. The width t2 of the top surface of the connection contact plug 17*c* may be substantially equal to or less than (FIG. 4) or greater than (FIG. 5) a width of a bottom surface of the conductive pattern 9 being in contact with the connection contact plug 17*c*. The width t1 of the bottom surface of the connection contact plug 17*c* may be less than (FIG. 4) or greater than (FIG. 5) a width t3 of a bottom surface of the deep device isolation portion 13.

The connection contact plug 17*c* may be disposed at substantially the same level as the first contact plugs 17*a*. For example, the bottom surface of the connection contact plug 17*c* may be disposed at substantially the same height as bottom surfaces of the first contact plugs 17*a*. The top surface of the connection contact plug 17*c* may be higher than top surfaces of the first contact plugs 17*a*. The connection contact plug 17*c* and the first contact plugs 17*a* may be formed of a different metal material from that of the first wiring lines 15. For example, the connection contact plug 17*c* and the first contact plugs 17*a* may include tungsten. Each of the connection contact plug 17*c* and the first contact plugs 17*a* may further include a barrier layer including a conductive metal nitride such as titanium nitride, tantalum nitride, and/or tungsten nitride.

Upper connection pads 21 may be disposed in a second interlayer insulating layer IL2 of the upper interlayer insulating layers IL, which is farthest from the first surface 1*a*. The upper connection pads 21 may be exposed at one surface of the first chip CH1 and may be in direct contact with lower connection pads 114 of the second chip CH2. The upper connection pads 21 may include, for example, copper. Metal patterns MP may be provided between the upper connection pads 21 and the first wiring lines 15. The metal patterns MP may be provided in the second interlayer insulating layer IL2. The metal patterns MP may include a conductive pad 34 provided in the pad region PAD. The conductive pad 34 may be connected directly to the upper connection pads 21. The conductive pad 34 may be connected to a circuit provided outside the chip by a bonding wire.

Second contact plugs 18 may be provided to connect the first wiring lines 15 to the metal patterns MP. A pad contact plug 18*c* of the second contact plugs 18 may connect the conductive pad 34 to the connection wiring structure CS. The second contact plugs 18 may include a different metal material from that of the first wiring lines 15. For example, the second contact plugs 18 may include any one or any combination of tungsten, titanium, tantalum, or any conductive nitride thereof.

As illustrated in FIGS. 3 and 4, the pad contact plug 18*c* may be formed at the same level as the second contact plugs 18 of the pixel region APS by the same process as the second contact plugs 18 of the pixel region APS. Alternatively, as illustrated in FIG. 5, the pad contact plug 18*c* may be formed along with the conductive pad 34. In this case, a first barrier layer BL1 may extend onto a sidewall of the pad contact plug 18*c*.

As illustrated in FIGS. 1 and 2, a plurality of the conductive pads 34 may be arranged along the pad region PAD provided around the pixel region APS. The conductive pads 34 may include a first conductive pad 34*a* electrically connected to the deep device isolation portion 13 through the connection wiring structure CS and the connection contact plug 17*c*. The conductive pads 34 may include second conductive pads 34*b* not electrically connected to the deep device isolation portion 13. Some of the second conductive pads 34*b* may be connected to transistors TR of the second chip CH2 through the upper connection pads 21 and the lower connection pads 114. In some embodiments, the image sensor 1000 may include a single first conductive pad 34*a* connected to the connection wiring structure CS, and a plurality of the connection contact plugs 17*c* may be connected in common to the connection wiring structure CS. Alternatively, in embodiments, the image sensor 1000 may include a plurality of the first conductive pads 34*a*. For example, a negative voltage may be applied to the conductive pattern 9 of the deep device isolation portion 13 through the first conductive pad 34*a*. Thus, it is possible to capture holes that may exist on a surface of the deep device isolation portion 13 due to dangling bonds generated by formation of the deep trench 3. As a result, a dark current may be reduced or minimized.

In the present embodiments, the metal patterns MP may include first metal patterns 31 provided in the pixel region APS and/or the optical black region OB. The first metal patterns 31 and the conductive pad 34 may be disposed at the same level. The metal patterns MP may include a different metal material from that of the upper connection pads 21. For example, the metal patterns MP may include aluminum. The first metal patterns 31 may cover the pixel region APS (more particularly, the unit pixels UP in the pixel region APS) to shield noise generated by an electromagnetic field induced by operation of circuits in the second chip CH2. In operation of the image sensor 1000, a ground voltage may be applied to the first metal patterns 31. Some of the first metal patterns 31 may be connected to the first wiring lines 15 through the second contact plugs 18.

Light may not be incident into the first substrate 1 of the optical black region OB. The deep device isolation portion 13 may also extend into the optical black region OB to isolate a first black pixel UP01 and a second black pixel UP02 from each other. The photoelectric conversion portion PD may be disposed in the first substrate 1 of the first black pixel UP01. The photoelectric conversion portion PD may not exist in the first substrate 1 of the second black pixel UP02. A transfer gate TG and a floating diffusion region FD may be disposed in each of the first and second black pixels UP01 and UP02. The first black pixel UP01 may sense the amount of charges generated from the photoelectric conversion portion PD into which light is not incident, and thus the first black pixel UP01 may provide a first reference charge amount. The first reference charge amount may be used as a relative reference value when the amounts of charges generated from the unit pixels UP are calculated. The second black pixel UP02 may sense the amount of charges generated in a state in which the photoelectric conversion portion PD does not exist, and thus the second black pixel UP02 may provide a second reference charge amount. The second reference charge amount may be used as data for removing process noise.

Reset transistors, selection transistors and source follower transistors may be disposed on the first surface 1*a* of the first substrate 1. The image sensor 1000 may be a backside illuminated image sensor. The second surface 1*b* of the first substrate 1 may be covered with a back insulating layer 23. The back insulating layer 23 may be provided in the pixel region APS, the optical black region OB, and the pad region PAD.

For example, the back insulating layer 23 may include any one or any combination of a bottom anti-reflective coating (BARC) layer, a fixed charge layer, an adhesive layer, an anti-reflection layer, or a protective layer. The fixed charge layer may include a metal oxide layer containing insufficient oxygen in terms of a stoichiometric ratio or a metal fluoride layer containing insufficient fluorine in terms of a stoichiometric ratio. Thus, the fixed charge layer may have negative fixed charges. The fixed charge layer may be formed of a metal oxide or metal fluoride including at least one metal of hafnium (Hf), zirconium (Zr), aluminum (Al), tantalum (Ta), titanium (Ti), yttrium (Y), or lanthanoid. Hole accumulation may occur around the fixed charge layer. Thus, a dark current and a white spot may be effectively reduced.

The anti-reflection layer may prevent reflection of light such that light incident on the second surface 1*b* of the first substrate 1 smoothly reaches the photoelectric conversion portion PD. For example, the anti-reflection layer may include a metal oxide (e.g., aluminum oxide or hafnium oxide) or a silicon-based insulating material (e.g., silicon oxide or silicon nitride).

In the pad region PAD, a recess region 25 may penetrate the back insulating layer 23 and the first substrate 1 and may penetrate a portion of the first interlayer insulating layer IL1. The recess region 25 may expose the conductive pad 34. A sidewall of the recess region 25 may be aligned with a sidewall of the back insulating layer 23. A width of the recess region 25 may increase as a distance from the conductive pad 34 increases. A pad isolation portion surrounding the recess region 25 and having a similar structure to the deep device isolation portion 13 may be provided in the pad region PAD. However, embodiments are not limited thereto.

In the optical black region OB, a diffusion barrier pattern 27*p* and a first optical black pattern 29*p* may be disposed on the back insulating layer 23. For example, the diffusion barrier pattern 27*p* may be formed of a metal nitride such as TiN, TaN, or WN. The first optical black pattern 29*p* may be formed of, for example, tungsten.

In the pixel region APS, a light blocking grid pattern 27*g* may be disposed on the back insulating layer 23. The light blocking grid pattern 27*g* may overlap with the deep device isolation portion 13 and may have a grid or lattice structure when viewed in a plan view. A low-refractive index pattern 71 may be disposed on the light blocking grid pattern 27*g*. The low-refractive index pattern 71 may include an organic material. The low-refractive index pattern 71 may have a refractive index lower than those of color filters CF1 and CF2. For example, the low-refractive index pattern 71 may have a refractive index of about 1.3 or less. The low-refractive index pattern 71 may overlap with the light blocking grid pattern 27*g* and may have the same planar shape as the light blocking grid pattern 27*g*.

In the pixel region APS, color filters CF1 and CF2 may be disposed between portions of the low-refractive index pattern 71. The color filters CF1 and CF2 may have different ones of a blue color, a green color and a red color. In the optical black region OB, a second optical black pattern CFB may be disposed on the back insulating layer 23. For example, the second optical black pattern CFB may include the same material as the blue color filter. A passivation layer 33 may be provided between the back insulating layer 23 and the color filters CF1 and CF2 and between the second optical black pattern CFB and the first optical black pattern 29*p*. The passivation layer 33 may include an insulating material such as a high-k dielectric material. For example, the passivation layer 33 may include aluminum oxide or hafnium oxide.

The pixel region APS and the optical black region OB may be covered with a micro lens layer ML. Unlike FIG. 3, the micro lens layer ML may also be provided in the pad region PAD. The micro lens layer ML may have a convex lens shape on each of the unit pixels UP of the pixel region APS. The micro lens layer ML may have a flat top surface on the optical black region OB.

The second chip CH2 may include a second substrate 100, a plurality of transistors TR disposed on the second substrate 100, a lower interlayer insulating layer 110 covering the second substrate 100, second wiring lines 112 disposed in the lower interlayer insulating layer 110, and the lower connection pads 114 connected to uppermost ones of the second wiring lines 112. The lower interlayer insulating layer 110 may have a single-layered or multi-layered structure including any one or any combination of a silicon oxide layer, a silicon nitride layer, a silicon oxynitride layer, or a porous insulating layer. The lower connection pads 114 may include the same material (e.g., copper) as the upper connection pads 21. The lower connection pads 114 may be exposed at one surface of the second chip CH2 and may be in direct contact with the upper connection pads 21 of the first chip CH1. The upper interlayer insulating layer IL may be in contact with the lower interlayer insulating layer 110. Hereinafter, a contact surface of the first chip CH1 and the second chip CH2 may be referred to as a connection interface CI.

Hereinafter, shapes and arrangements of the metal patterns MP and the connection pads 21 and 114 will be described in more detail.

Referring to FIGS. 2 to 5, each of the metal patterns MP may include the first barrier layer BL1 provided on its bottom surface and top surface. The first barrier layer BL1 may not be provided on sidewalls of the metal patterns MP. The first barrier layer BL1 may include any one or any combination of titanium, tantalum, tungsten, or any conductive metal nitride thereof. The recess region 25 may penetrate the first barrier layer BL1 of the top surface of the metal pattern MP (i.e., the conductive pad 34). A width of each of the metal patterns MP may become progressively less toward the second chip CH2.

Each of the connection pads 21 and 114 may include a second barrier layer BL2. The second barrier layer BL2 may include any one or any combination of titanium, tantalum, tungsten, or any conductive metal nitride thereof. For example, the second barrier layer BL2 may be provided on a top surface and a sidewall of each of the upper connection pads 21 but may not be provided on a bottom surface of each of the upper connection pads 21, which is in contact with the lower connection pad 114. Likewise, the second barrier layer BL2 may be provided on a bottom surface and a sidewall of each of the lower connection pads 114 but may not be provided on a top surface of each of the lower connection pads 114, which is in contact with the upper connection pad 21. In other words, the second barrier layer BL2 may not be provided at the connection interface CI. Contrary to the metal patterns MP, a width of each of the upper connection pads 21 may become progressively greater toward the second chip CH2. A width of each of the lower connection pads 114 may become progressively greater toward the first chip CH1.

The upper connection pads 21 may include first upper connection pads 21*a* provided in the pixel region APS, second upper connection pads 21*b* provided in the optical black region OB, and third upper connection pads 21*c* provided in the pad region PAD. The lower connection pads 114 may include first lower connection pads 114*a* connected to the first upper connection pads 21*a*, second lower connection pads 114*b* connected to the second upper connection pads 21*b*, and third lower connection pads 114*c* connected to the third upper connection pads 21*c*.

Some of the upper connection pads 21 may include vias VI (see FIG. 4) provided thereon. For example, as illustrated in FIG. 4, the third upper connection pad 21*c* may be connected to the conductive pad 34 through the via VI. Likewise, some of the first upper connection pads 21*a* may be connected to the first metal patterns 31 through the vias VI.

Alternatively, the conductive pad 34 may not be connected to the third upper connection pad 21*c*. Some of the lower connection pads 114 may include vias VI provided thereunder. For example, the conductive pad 34 may be electrically connected to the second wiring lines 112 through the third upper connection pad 21*c* and the third lower connection pad 114*c*.

The second interlayer insulating layer IL2 may include a first connection insulating layer CL1 at the connection interface CI. The lower interlayer insulating layer 110 may include a second connection insulating layer CL2 at the connection interface CI. The first connection insulating layer CL1 may be in direct contact with the second connection insulating layer CL2. For example, each of the first and second connection insulating layers CL1 and CL2 may include any one or any combination of SiCN, SiOCN, or SiC.

A thickness of each of the metal patterns MP may be greater than a thickness of each of the upper connection pads 21. The thickness of each of the metal patterns MP may be greater than a thickness of each of the lower connection pads 114. Alternatively, the thickness of each of the metal patterns MP may be less than the thickness of each of the upper connection pads 21 and the thickness of each of the lower connection pads 114. The thickness of each of the metal patterns MP may be greater than a thickness of each of the second contact plugs 18. For example, the thickness of each of the metal patterns MP may range from about 11000 Å to about 15000 Å. A thickness of the first barrier layer BL1 may range from about 100 Å to about 600 Å. The thickness of each of the upper and lower connection pads 21 and 114 may range from about 6000 Å to about 12000 Å.

According to the embodiments, the conductive pad 34 and the deep device isolation portion 13 may be electrically connected to each other through the connection wiring structure CS and the connection contact plug 17*c*. The connection contact plug 17*c* may be provided on the first surface 1*a* of the first substrate 1, and thus a structure for applying a voltage to the deep device isolation portion 13 may not be provided on the second surface 1*b* of the first substrate 1. If a contact structure for connection with the deep device isolation portion 13 is formed on the second surface 1*b* of the first substrate 1, a step difference between this contact structure and the pixel region APS may be formed to cause an unintended striation defect at the color filters in formation of the color filters.

However, according to the embodiments, a voltage may be applied to the deep device isolation portion 13 through the connection wiring structure CS and the connection contact plug 17*c*, and thus the process defect may be prevented. In addition, the connection contact plug 17*c* may have a high degree of freedom with respect to its formation position, and thus the connection contact plug 17*c* may be formed at a position where interference with other contact plugs and/or wiring lines is minimized.

FIGS. 6, 7, 8 and 9 are plan views illustrating arrangements and shapes of the connection contact plug 17*c*, the connection wiring structure CS and the pad contact plug 18*c*, which are provided in the optical black region OB, according to embodiments.

The connection wiring structure CS may have a width wider than that in the embodiments of FIGS. 2 to 5. For example, the connection wiring structure CS may extend under the black pixels UP01 and UP02.

Figure 6:
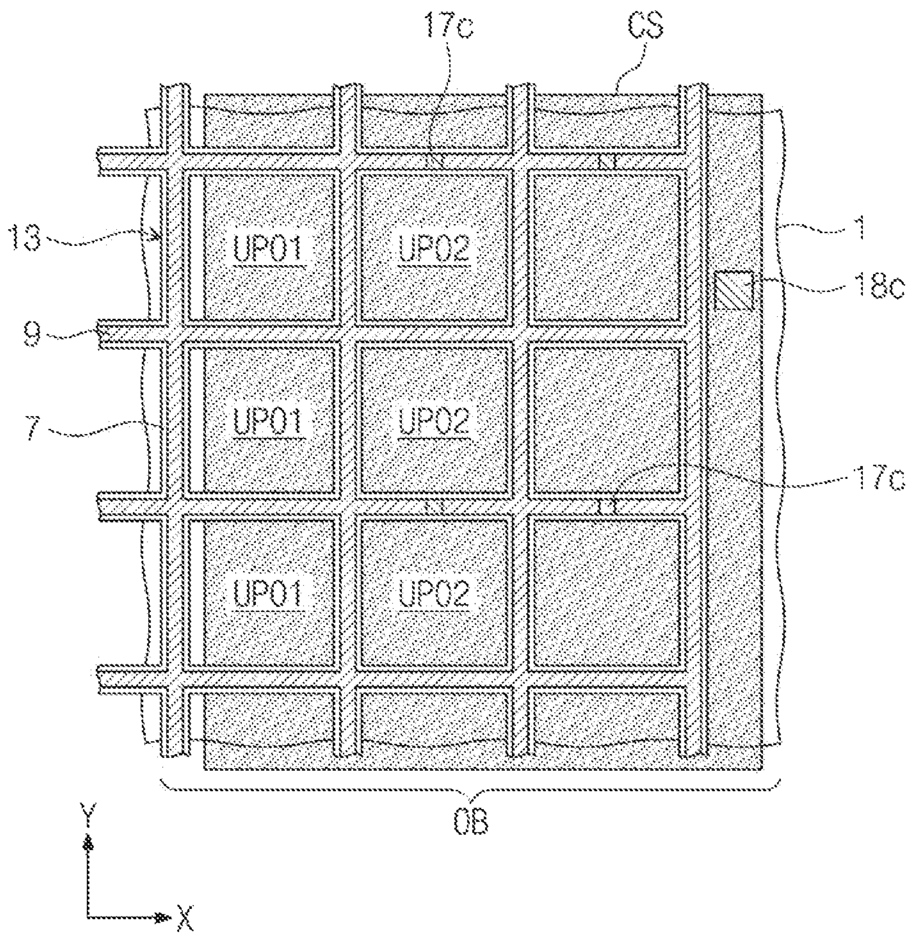
FIGS. 6, 7, 8 and 9 are plan views illustrating arrangements and shapes of a connection contact plug, a connection wiring structure and a pad contact plug, which are provided in an optical black region, according to embodiments.
Figure 7:
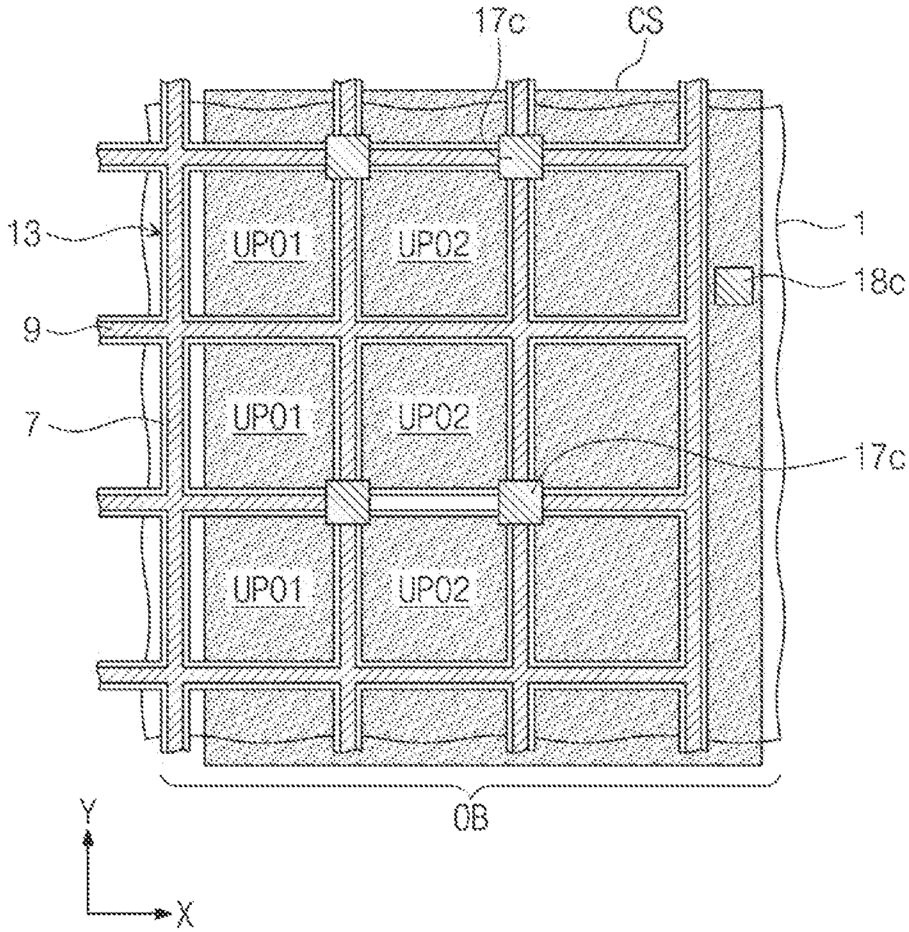

The shape and arrangement of the connection contact plug 17*c* may be variously modified. Referring to FIG. 6, a width, in a Y direction, of each of a plurality of the connection contact plugs 17*c* may be substantially equal to a width, in the Y direction, of the conductive pattern 9 of the deep device isolation portion 13 connected to the connection contact plugs 17*c*. Referring to FIG. 7, widths of each of connection contact plugs 17*c* in the Y direction and an X direction may be greater than widths of the conductive pattern 9 in the Y direction and the X direction, respectively. Like FIG. 7, the deep device isolation portion 13 may include intersection points at which portions extending in the X direction intersect portions extending in the Y direction, and the connection contact plugs 17*c* may be disposed at the intersection points. Alternatively, as illustrated in FIG. 6, the connection contact plugs 17*c* may be disposed at positions that are not the intersection points.

Figure 8:
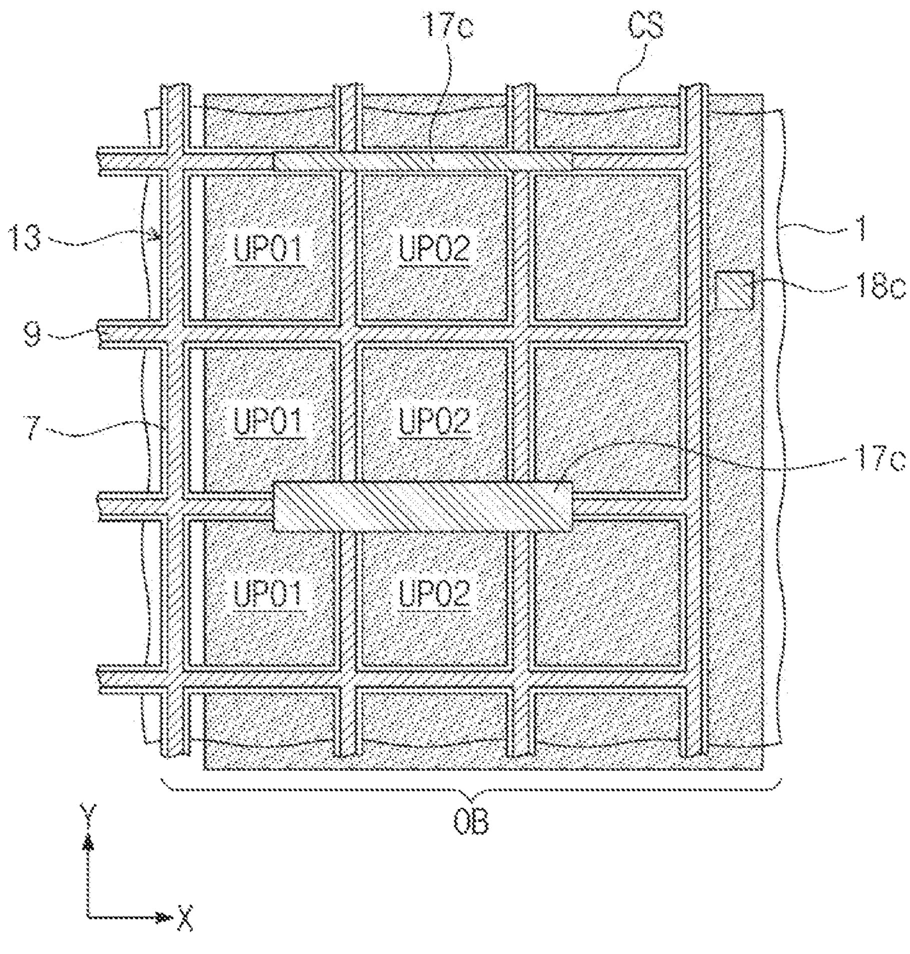

Referring to FIG. 8, the connection contact plug 17*c* may have a bar shape extending in one direction. A width of the connection contact plug 17*c* in the Y direction may be substantially equal to or greater than the width of the conductive pattern 9. Unlike FIG. 8, the connection contact plug 17*c* may extend in the Y direction.

Figure 9:
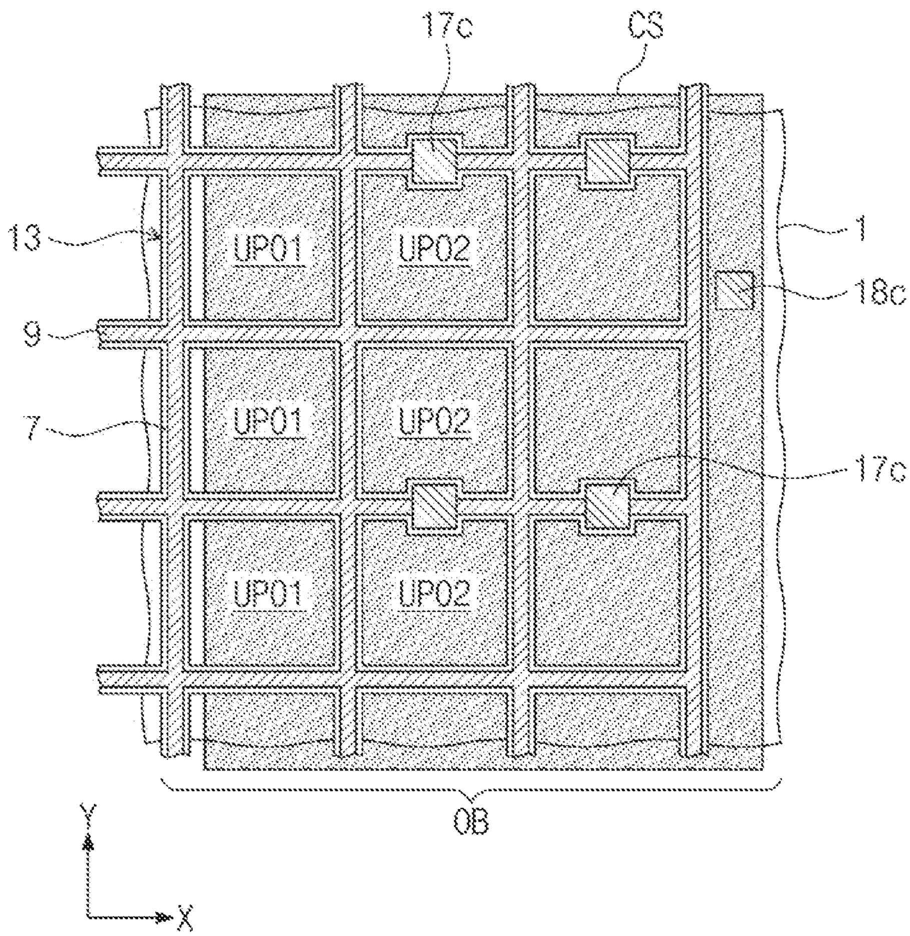

Referring to FIG. 9, widths, in the Y direction and/or the X direction, of portions of the deep device isolation portion 13 connected to the connection contact plugs 17*c* may be greater than a width, in the Y direction and/or the X direction, of another portion of the deep device isolation portion 13.

The components of the embodiments of FIGS. 2 to 9 may be combined or replaced with each other in the spirits and scopes of the embodiments.

Figure 10:
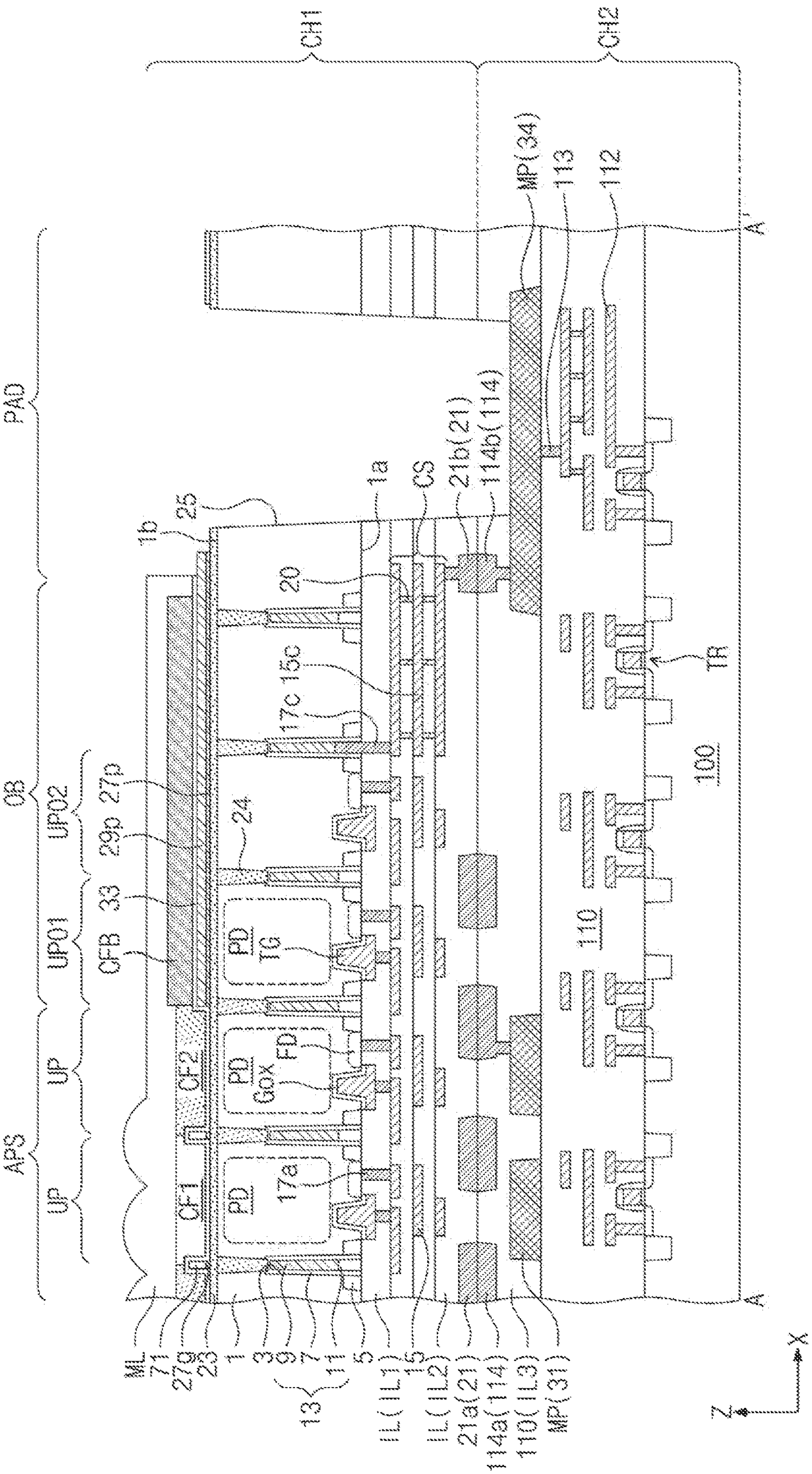
FIG. 10 is a cross-sectional view taken along the line A-A' of FIG. 2 to illustrate an image sensor according to an embodiment.

FIG. 10 is a cross-sectional view taken along the line A-A' of FIG. 2 to illustrate an image sensor according to an embodiment. Hereinafter, the descriptions to the same components as in the above embodiments may be omitted for the purpose of ease and convenience in explanation.

Referring to FIG. 10, a deep device isolation portion 13 may be spaced apart from a back insulating layer 23, and a back device isolation portion 24 may be provided between the back insulating layer 23 and the deep device isolation portion 13. The back device isolation portion 24 may be formed of an insulating layer. The back device isolation portion 24 may have the same lattice or grid structure as the deep device isolation portion 13 when viewed in a plan view. Lower portions of the back device isolation portion 24 may be connected to upper portions of the deep device isolation portion 13. The back device isolation portion 24 may not include a crystalline semiconductor material (e.g., polysilicon). The back device isolation portion 24 may include a fixed charge layer formed of a metal oxide layer containing insufficient oxygen in terms of a stoichiometric ratio or a metal fluoride layer containing insufficient fluorine in terms of a stoichiometric ratio. The fixed charge layer may have negative fixed charges. The fixed charge layer may be formed of a metal oxide or metal fluoride including at least one metal of hafnium (Hf), zirconium (Zr), aluminum (Al), tantalum (Ta), titanium (Ti), yttrium (Y), or lanthanoid. Hole accumulation may occur around the fixed charge layer. At least a portion of the back device isolation portion 24 may be formed together with the back insulating layer 23.

In the present embodiments, metal patterns MP may be provided in a second chip CH2. For example, a lower interlayer insulating layer 110 of the second chip CH2 may include a third interlayer insulating layer IL3 provided in its upper portion, and first metal patterns 31 and a conductive pad 34 may be provided in the third interlayer insulating layer IL3. A recess region 25 may completely penetrate a first chip CH1 to expose the conductive pad 34. The conductive pad 34 may be electrically connected to a connection wiring structure CS through a second lower connection pad 114*b* and a second upper connection pad 21*b*. A pad contact plug 113 connecting the conductive pad 34 to second wiring lines 112 may be provided. Alternatively, the conductive pad 34 may not be connected to the second wiring lines 112. A width of each of the metal patterns MP may become progressively less toward the first chip CH1.

The embodiments of FIG. 10 may be combined with the embodiments of FIG. 3. For example, in the embodiments of FIG. 10, the metal patterns MP may be provided in the first chip CH1, like FIG. 3.

Figure 11:
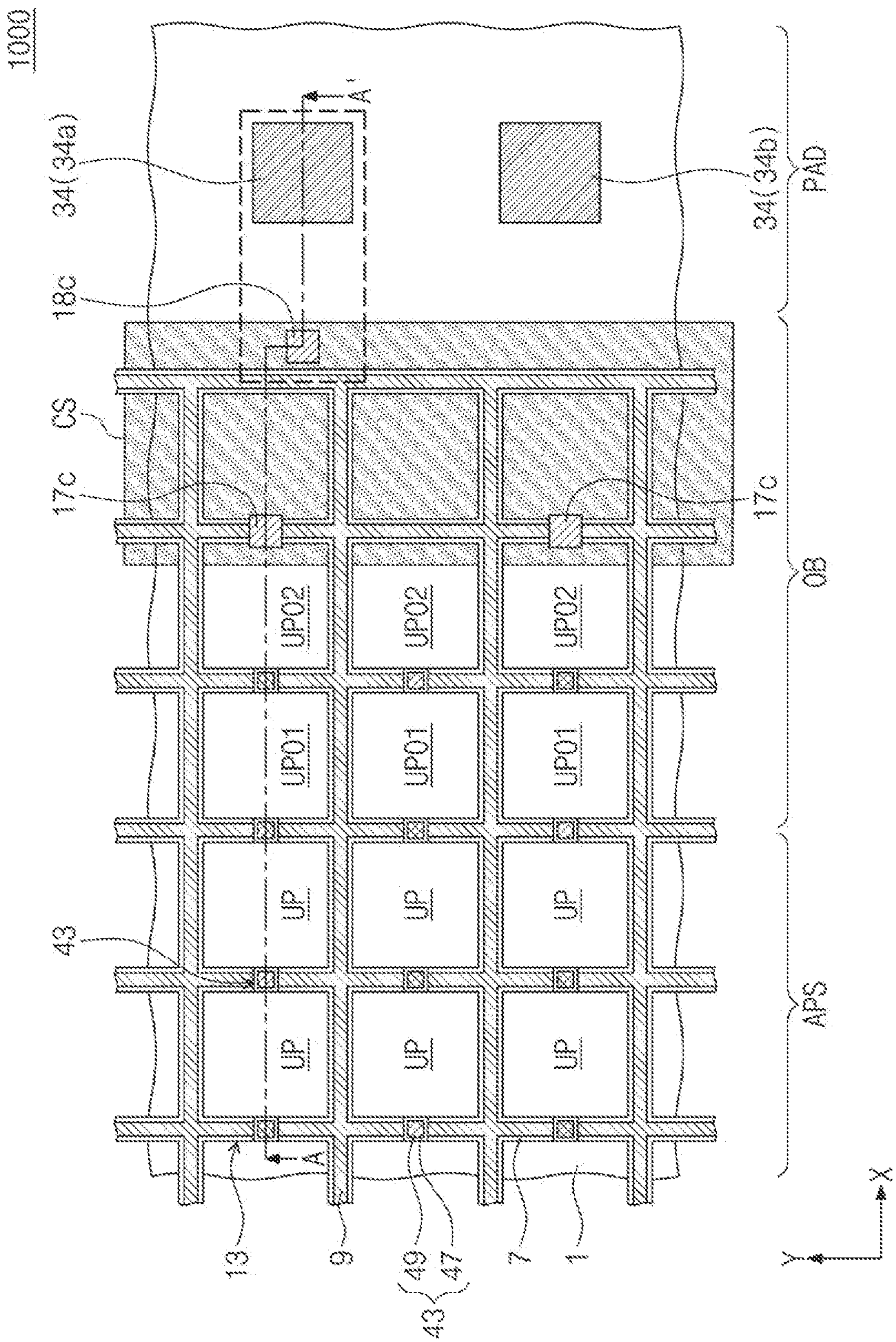
FIG. 11 is a plan view illustrating an image sensor according to an embodiment.
Figure 12:
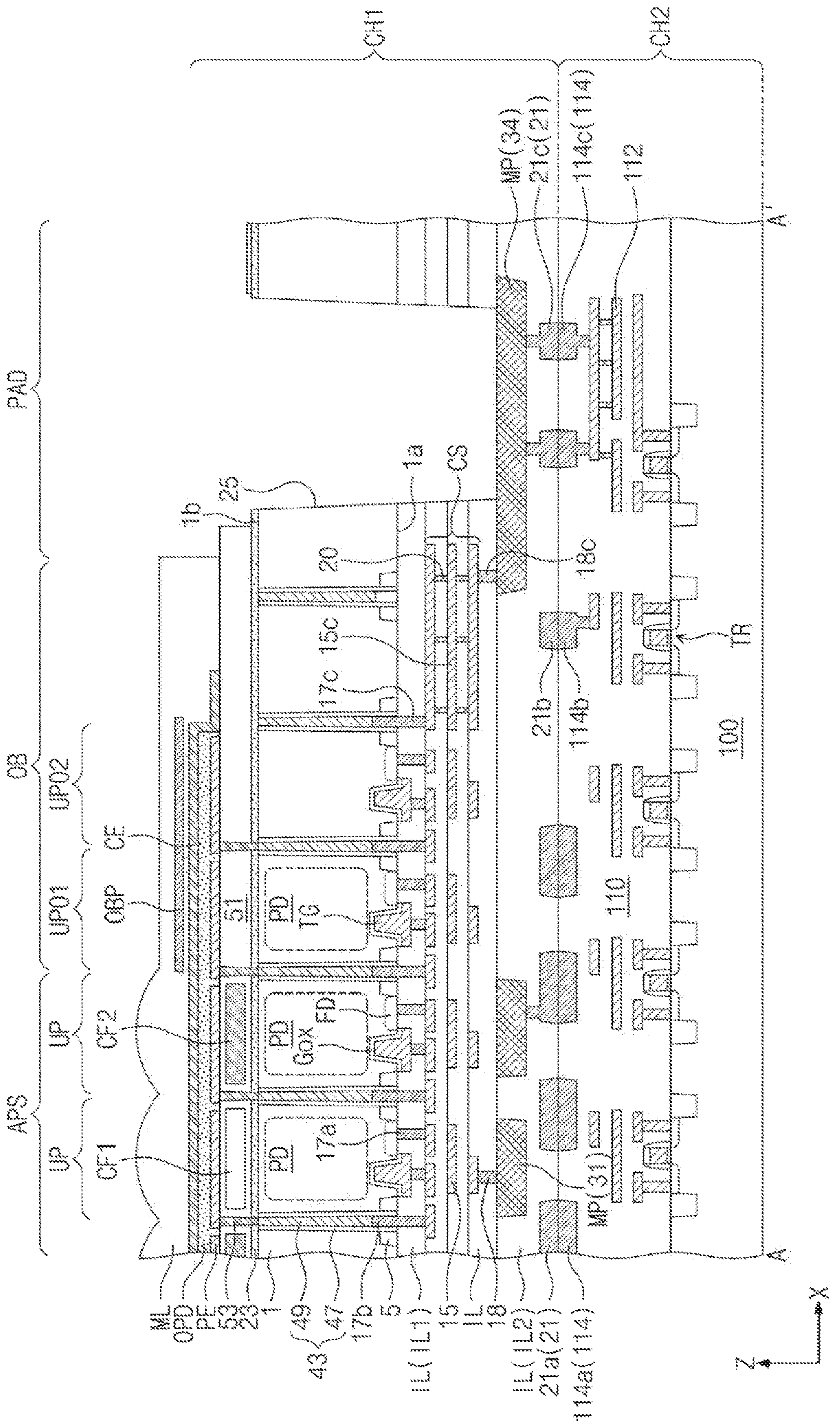
FIG. 12 is a cross-sectional view taken along a line A-A' of FIG. 11.

FIG. 11 is a plan view illustrating an image sensor 1000 according to an embodiment. FIG. 12 is a cross-sectional view taken along a line A-A' of FIG. 11. Hereinafter, the descriptions to the same components as in the above embodiments may be omitted for the purpose of ease and convenience in explanation.

Referring to FIGS. 11 and 12, the image sensor 1000 according to the present embodiments may be an example of an organic CMOS image sensor. A through-structure 43 may be disposed between unit pixels UP when viewed in a plan view. The through-structure 43 may penetrate a deep device isolation portion 13 between adjacent unit pixels UP to divide the deep device isolation portion 13 into two segments. The through-structure 43 may include a through-conductive pattern 49 and a through-isolation insulating layer 47. The through-isolation insulating layer 47 may insulate the through-conductive pattern 49 from the conductive pattern 9 of the deep device isolation portion 13. The through-conductive pattern 49 may include the same material as the conductive pattern 9 of the deep device isolation portion 13. A third contact plug 17*b* may penetrate a first interlayer insulating layer IL1 to connect the through-conductive pattern 49 to a corresponding one of first wiring lines 15. The third contact plug 17*b* may be formed together with first contact plugs 17*a* and a connection contact plug 17*c*, and a height of a bottom surface of the third contact plug 17*b* may be substantially the same as heights of bottom surfaces of the connection contact plug 17*c* and the first contact plugs 17*a*.

The first optical black pattern 29*p* described with reference to FIG. 3 may not be provided. Color filters CF1 and CF2 may be disposed on the back insulating layer 23 in the pixel region APS. In the present embodiments, the color filters CF1 and CF2 may have different ones of a blue color and a red color. The color filters CF1 and CF2 may be covered with a planarization layer 51. In the pixel region APS and the optical black region OB, pixel electrodes PE may be disposed on the planarization layer 51 and may be spaced apart from each other. Fourth contact plugs 53 may penetrate the planarization layer 51 to connect the pixel electrodes PE to the through-conductive patterns 49. The planarization layer 51 may include any one or any combination of a silicon oxide layer or a silicon nitride layer. The pixel electrodes PE may be covered with an organic photoelectric conversion layer OPD. The organic photoelectric conversion layer OPD may include a P-type organic semiconductor material and an N-type organic semiconductor material, which form a PN junction. Alternatively, the organic photoelectric conversion layer OPD may include quantum dots or a chalcogenide material. The organic photoelectric conversion layer OPD may perform photoelectric conversion of light having a color (e.g., a green color). A common electrode CE may be disposed on the organic photoelectric conversion layer OPD. The pixel electrodes PE and the common electrode CE may include indium tin oxide (ITO), indium zinc oxide (IZO), zinc oxide (ZnO), and/or an organic transparent conductive material.

A micro lens layer ML may be disposed on the common electrode CE. A second optical black pattern OBP may be disposed in the micro lens layer ML in the optical black region OB. The second optical black pattern OBP may include, for example, an opaque metal (e.g., aluminum). The image sensor according to the present embodiments may include the organic photoelectric conversion layer OPD, and thus each of the unit pixels UP may sense two colors of light at the same time.

FIGS. 13, 14, 15, 16, 17, 18 and 19 are cross-sectional views taken along the line A-A' of FIG. 2 to illustrate a method of manufacturing an image sensor, according to embodiments.

Figure 13:
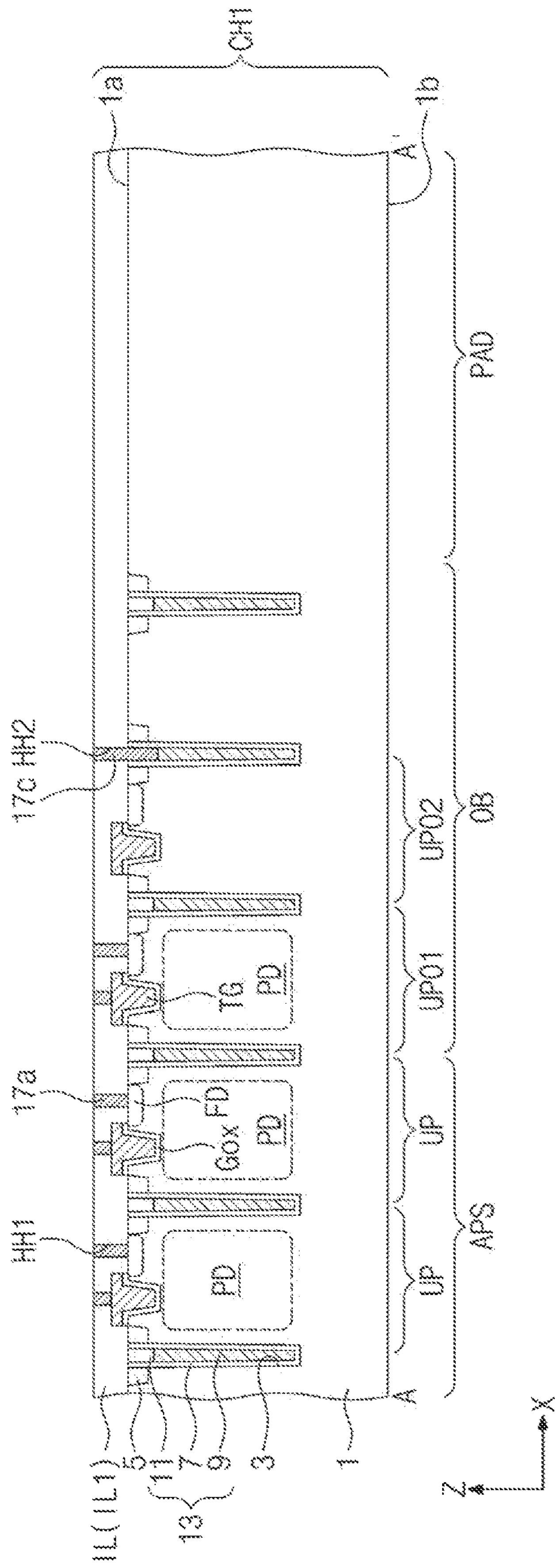
FIGS. 13, 14, 15, 16, 17, 18 and 19 are cross-sectional views taken along the line A-A' of FIG. 2 to illustrate a method of manufacturing an image sensor, according to embodiments.

Referring to FIGS. 2 and 13, a first chip CH1 may be manufactured. An ion implantation process may be performed on a first substrate 1 including a pixel region APS, an optical black region OB and a pad region PAD, thereby forming photoelectric conversion portions PD. A shallow device isolation portion 5 may be formed in a first surface 1*a* of the first substrate 1 to define active regions. The shallow device isolation portion 5 may be formed by a shallow trench isolation (STI) process. Deep trenches 3 may be formed by etching the shallow device isolation portion 5 and a portion of the first substrate 1. The deep trenches 3 may define unit pixels UP and black pixels UP01 and UP02 in the pixel region APS and the optical black region OB. The deep trenches 3 may not be formed in the pad region PAD.

An isolation insulating layer 7 may be conformally formed on the whole of the first surface 1*a* of the first substrate 1, and then, the deep trenches 3 may be filled with a conductive material. An etch-back process may be performed on the conductive material to form conductive patterns 9 in the deep trenches 3, respectively. Subsequently, filling insulation patterns 11 may be formed on the conductive patterns 9, and the isolation insulating layer 7 on the first surface 1*a* may be removed to expose the first surface 1*a*. As a result, a deep device isolation portion 13 including the conductive patterns 9, the isolation insulating layer 7 and the filling insulation patterns 11 may be formed.

A gate insulating layer Gox, transfer gates TG, floating diffusion regions FD and a first interlayer insulating layer IL1 may be formed on the first surface 1*a* of the first substrate 1. First contact plugs 17*a* and a connection contact plug 17*c* may be formed to penetrate the first interlayer insulating layer IL1. The first contact plugs 17*a* may be formed in first contact holes HH1, each of which exposes the floating diffusion region FD or the transfer gate TG. The connection contact plug 17*c* may be formed in a second contact hole HH2 that penetrates the filling insulation pattern 11 to expose the conductive pattern 9. The first contact holes HH1 and the second contact hole HH2 may be formed at the same time or may be sequentially formed. A conductive material may be formed to fill the first contact holes HH1 and the second contact hole HH2, and then, a planarization process may be performed on the conductive material.

Figure 14:
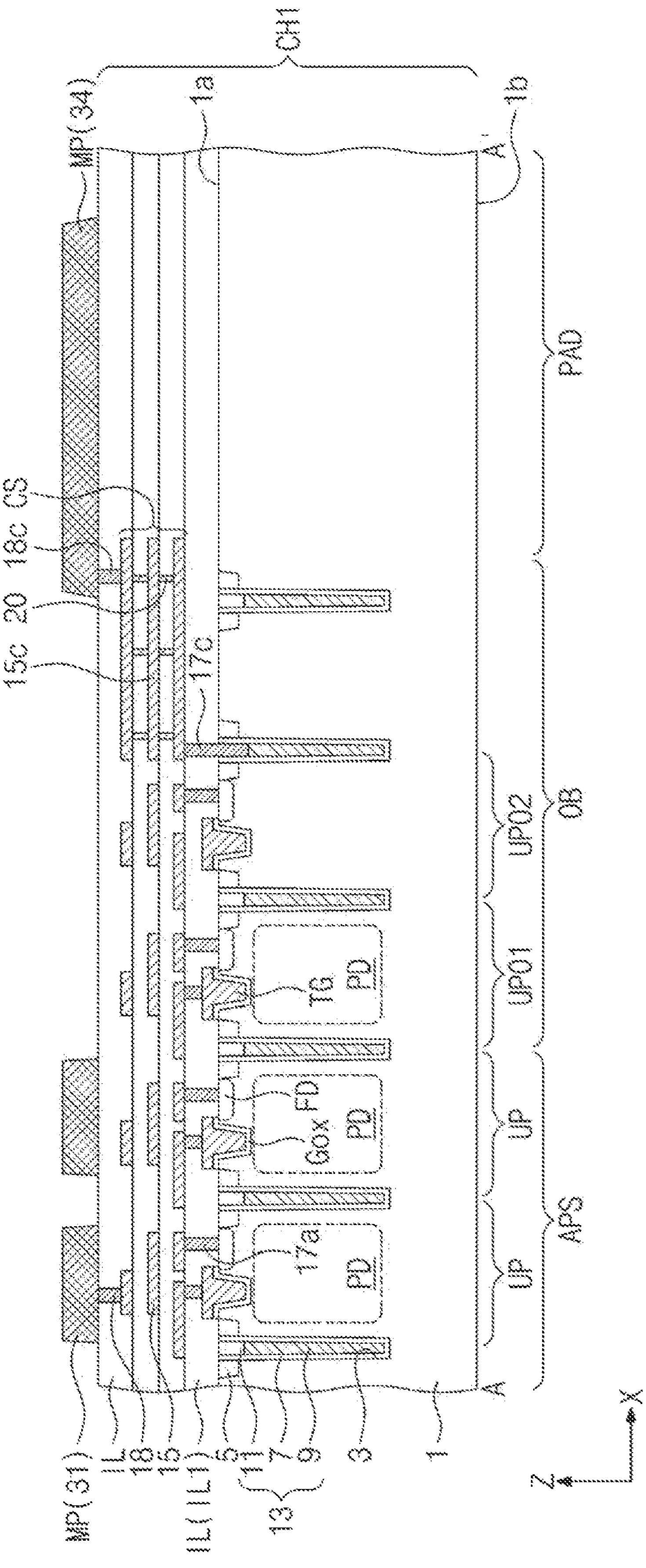

Referring to FIGS. 2 and 14, first wiring lines 15 and upper interlayer insulating layers IL may be formed on the first interlayer insulating layer IL1. For example, the first wiring lines 15 may include copper. Intermediate contacts 20 may be formed between the first wiring lines 15 to connect the first wiring lines 15 to each other. For example, the intermediate contacts 20 may include the same material as the first wiring lines 15 and may be formed simultaneously with the first wiring lines 15. In the optical black region OB, connection wiring lines 15*c* and the intermediate contacts 20 therebetween may constitute a connection wiring structure CS.

Second contact plugs 18 connected to the first wiring lines 15 may be formed in the upper interlayer insulating layer IL. The second contact plugs 18 may include a pad contact plug 18*c*. The second contact plugs 18 may be formed of a different metal material from that of the first wiring lines 15. For example, the second contact plugs 18 may include tungsten. The second contact plugs 18 may further include a barrier layer including a conductive metal nitride such as titanium nitride, tantalum nitride, and/or tungsten nitride. The second contact plugs 18 may be formed by a damascene process. For example, the formation of the second contact plugs 18 may include forming via holes penetrating an uppermost upper interlayer insulating layer IL to expose the first wiring lines 15, sequentially forming a metal nitride layer and a metal layer in the via holes, and performing a planarization process on the metal layer and the metal nitride layer.

Metal patterns MP may be formed on the second contact plugs 18. The metal patterns MP may include a conductive pad 34 provided in the pad region PAD, and a first metal pattern 31 provided in the pixel region APS. In embodiments, the metal pattern MP may also be formed in the optical black region OB. For example, the metal patterns MP may be formed of aluminum. The formation of the metal patterns MP may include forming a conductive layer covering the upper interlayer insulating layer IL, and etching the conductive layer to form the conductive pad 34 and the first metal pattern 31, which are separated from each other. In this case, the conductive layer may include first barrier layers BL1 on its top surface and bottom surface, as described with reference to FIGS. 4 and 5. For example, the formation of the metal patterns MP may include sequentially forming a first titanium nitride layer, an aluminum layer and a second titanium nitride layer, and patterning them. Because the metal patterns MP are formed by the etching process, a width of an upper portion of the metal pattern MP may be less than a width of a lower portion of the metal pattern MP, and the first barrier layer BL1 may not be provided on sidewalls of the metal patterns MP.

Figure 15:
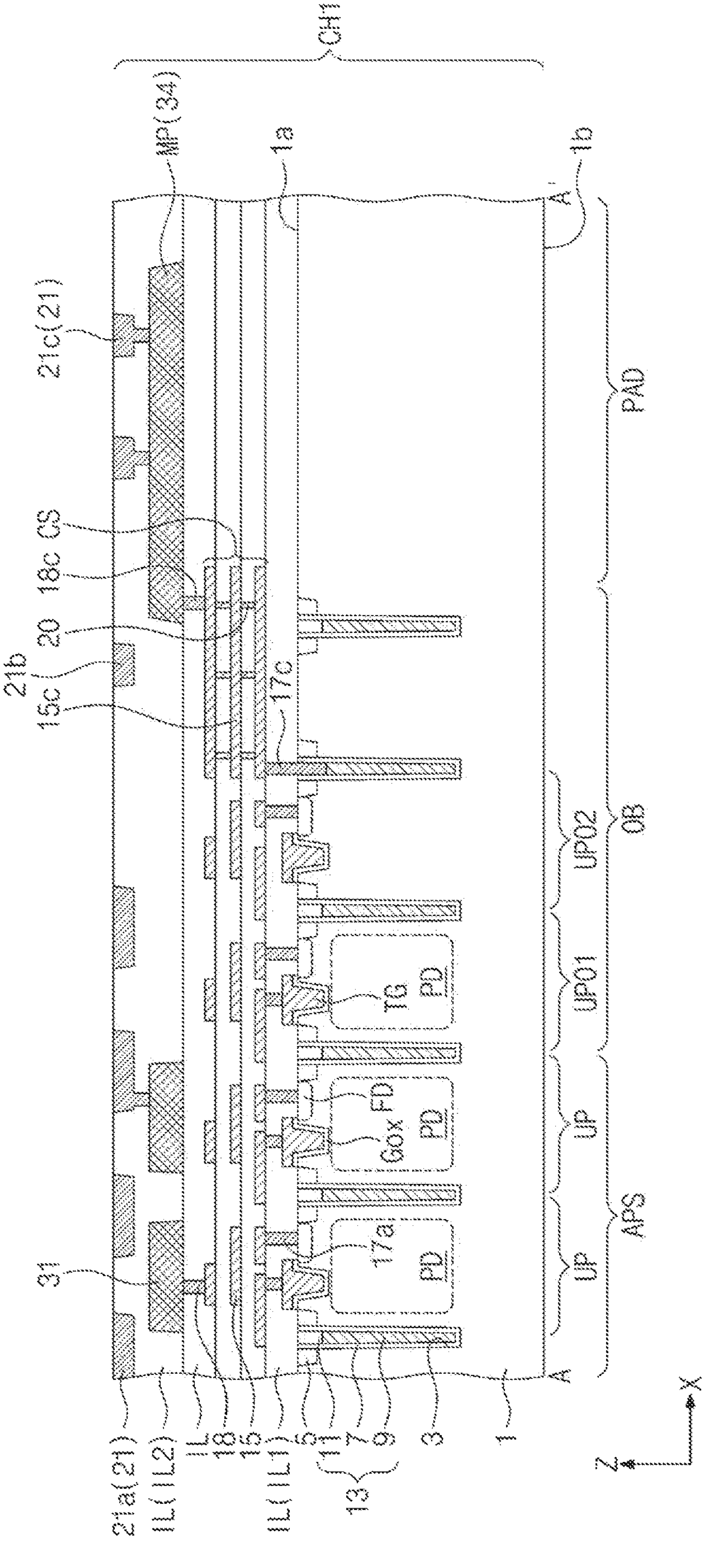

Referring to FIGS. 2 and 15, a second interlayer insulating layer IL2 may be formed to cover the metal patterns MP, and then, upper connection pads 21 connected to the metal patterns MP may be formed in the second interlayer insulating layer IL2. An upper portion of the second interlayer insulating layer IL2 may include the first connection insulating layer CL1 described with reference to FIGS. 4 and 5. For example, the first connection insulating layer CL1 may include any one or any combination of SiCN, SiOCN, or SiC.

The upper connection pads 21 may be formed by a damascene process. For example, the upper connection pads 21 may include copper. Each of the upper connection pads 21 may include the second barrier layer BL2 described with reference to FIGS. 4 and 5. The second barrier layer BL2 may include any one or any combination of titanium, tantalum, tungsten, or any conductive metal nitride thereof. For example, the formation of the upper connection pads 21 may include forming recess regions in an upper portion of the second interlayer insulating layer IL2, forming the second barrier layer BL2 and a copper layer in the recess regions, and performing a planarization process until the second interlayer insulating layer IL2 is exposed. For example, the copper layer may be formed by an electroplating process using a metal seed layer. When the recess regions are formed, upper portions (e.g., the first barrier layers BL1) of the metal patterns MP may also be etched. The upper connection pads 21 may include first upper connection pads 21*a*, second upper connection pads 21*b*, and third upper connection pads 21*c*.

Figure 16:
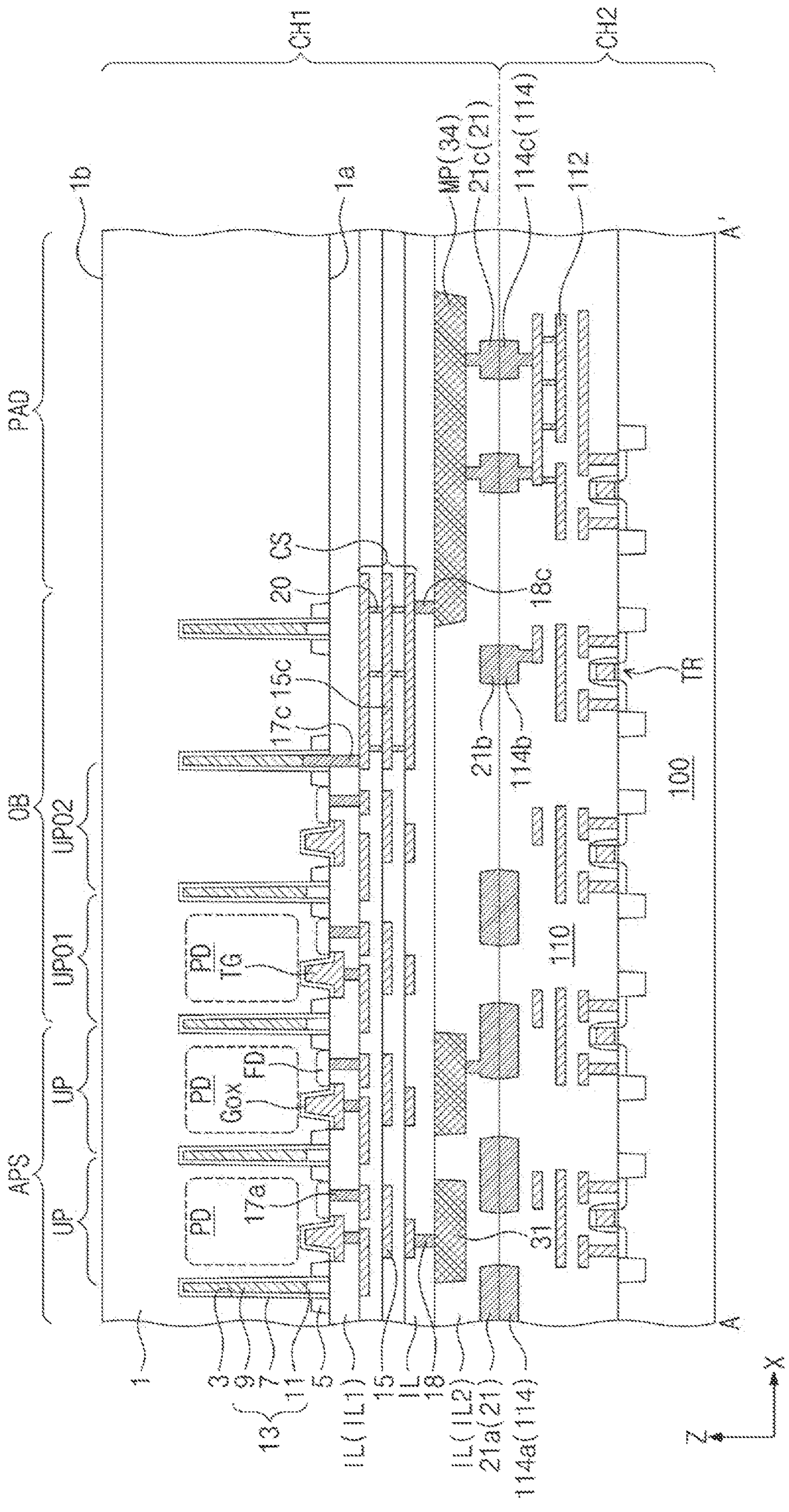

Referring to FIGS. 2 and 16, a second chip CH2 having the structure described with reference to FIG. 3 may be prepared. The first chip CH1 may be turned over. The first chip CH1 may be located on the second chip CH2 in such a way that the upper interlayer insulating layer IL is in contact with a lower interlayer insulating layer 110 and the upper connection pads 21 are in contact with lower connection pads 114, and then, a thermal compression process may be performed to bond the first chip CH1 and the second chip CH2 to each other.

Figure 17:
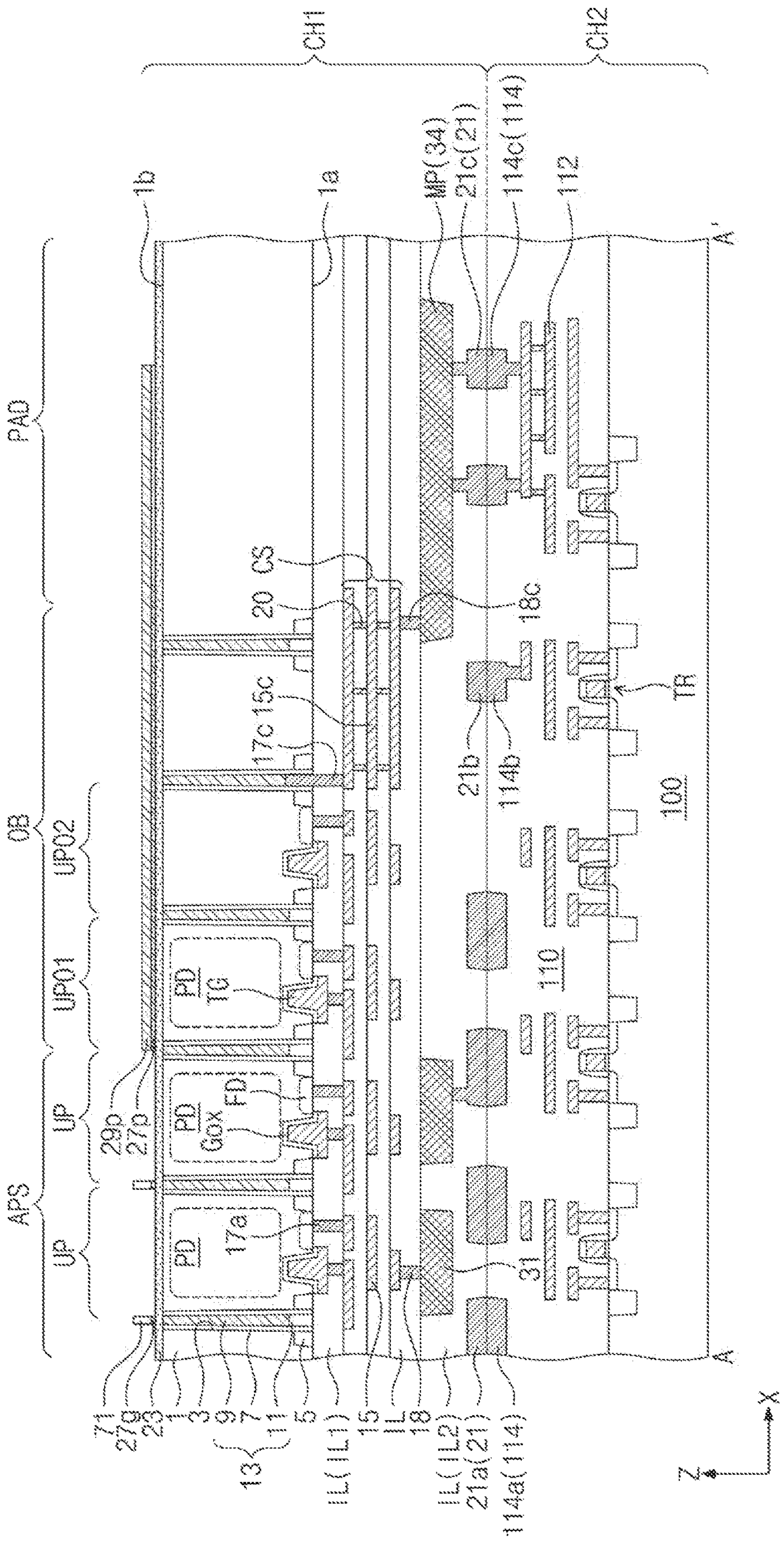

Referring to FIGS. 2 and 17, a grinding process may be performed on a second surface 1*b* of the first substrate 1 in the state of FIG. 16, thereby reducing a thickness of the first substrate 1. At this time, the conductive pattern 9 of the deep device isolation portion 13 may be exposed. A back insulating layer 23 may be deposited on the second surface 1*b* of the first substrate 1.

A diffusion barrier layer and a first optical black layer may be conformally formed on the second surface 1*b* of the first substrate 1, and then, a patterning process may be performed on the first optical black layer. As a result, a first optical black pattern 29*p* may be formed in the optical black region OB and the pad region PAD. The diffusion barrier layer in the pixel region APS may be exposed by the patterning process. A low-refractive index layer may be formed to cover the diffusion barrier layer exposed in the pixel region APS, and then, a patterning process may be performed to form a low-refractive index pattern 71 and a light blocking grid pattern 27*g* in the pixel region APS and to form a diffusion barrier pattern 27*p* in the optical black region OB and the pad region PAD. The low-refractive index layer may be formed by, for example, a spin-coating process.

Figure 18:
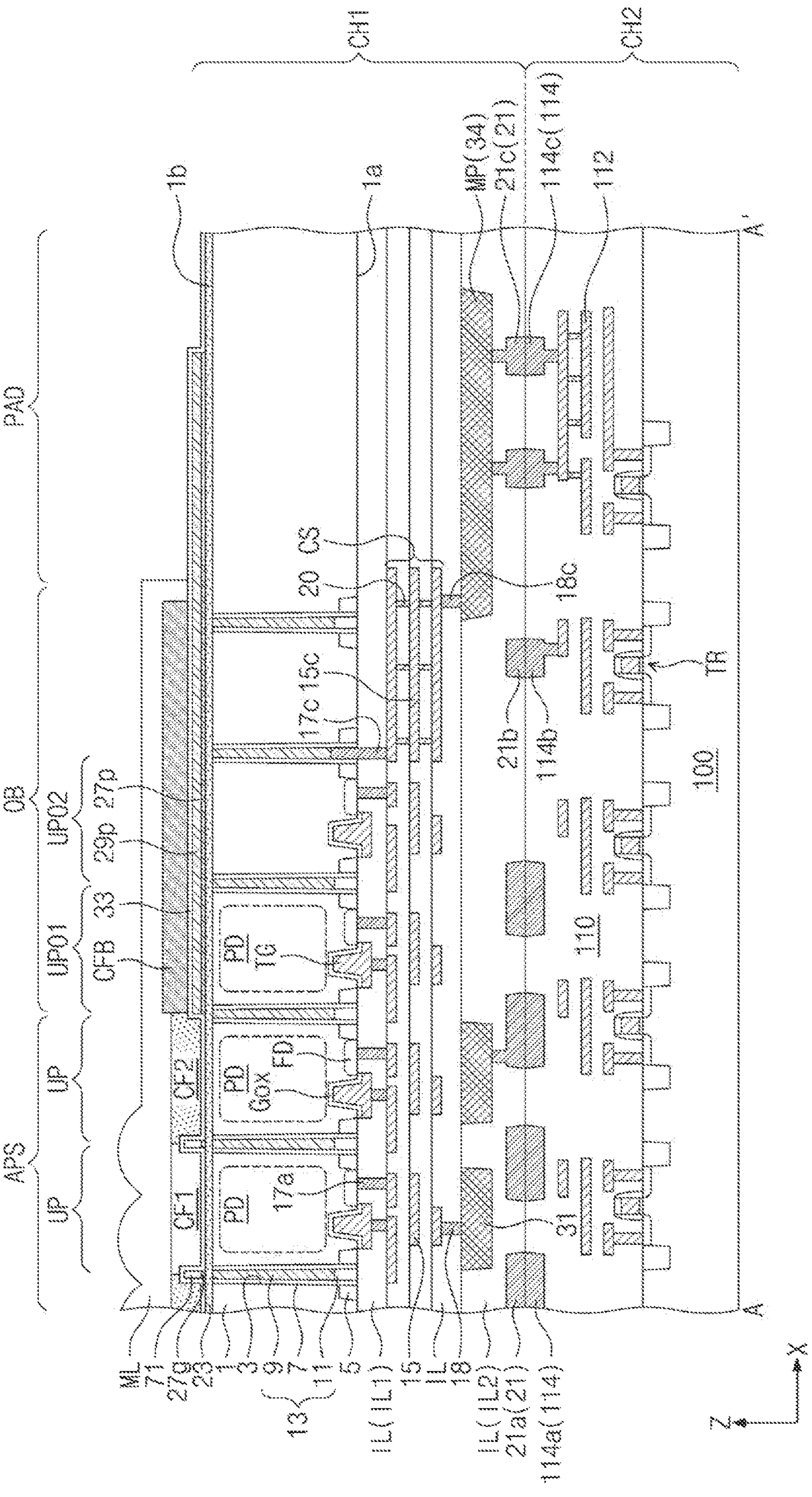

Referring to FIGS. 2 and 18, a passivation layer 33 may be conformally formed on the whole of the second surface 1*b* of the first substrate 1. Thereafter, color filters CF1 and CF2 and a second optical black pattern CFB may be formed. The second optical black pattern CFB may be formed simultaneously with a blue color filter. Subsequently, a micro lens layer ML may be formed on the color filters CF1 and CF2 and the second optical black pattern CFB. The micro lens layer ML may be formed in the pixel region APS and the optical black region OB.

Figure 19:
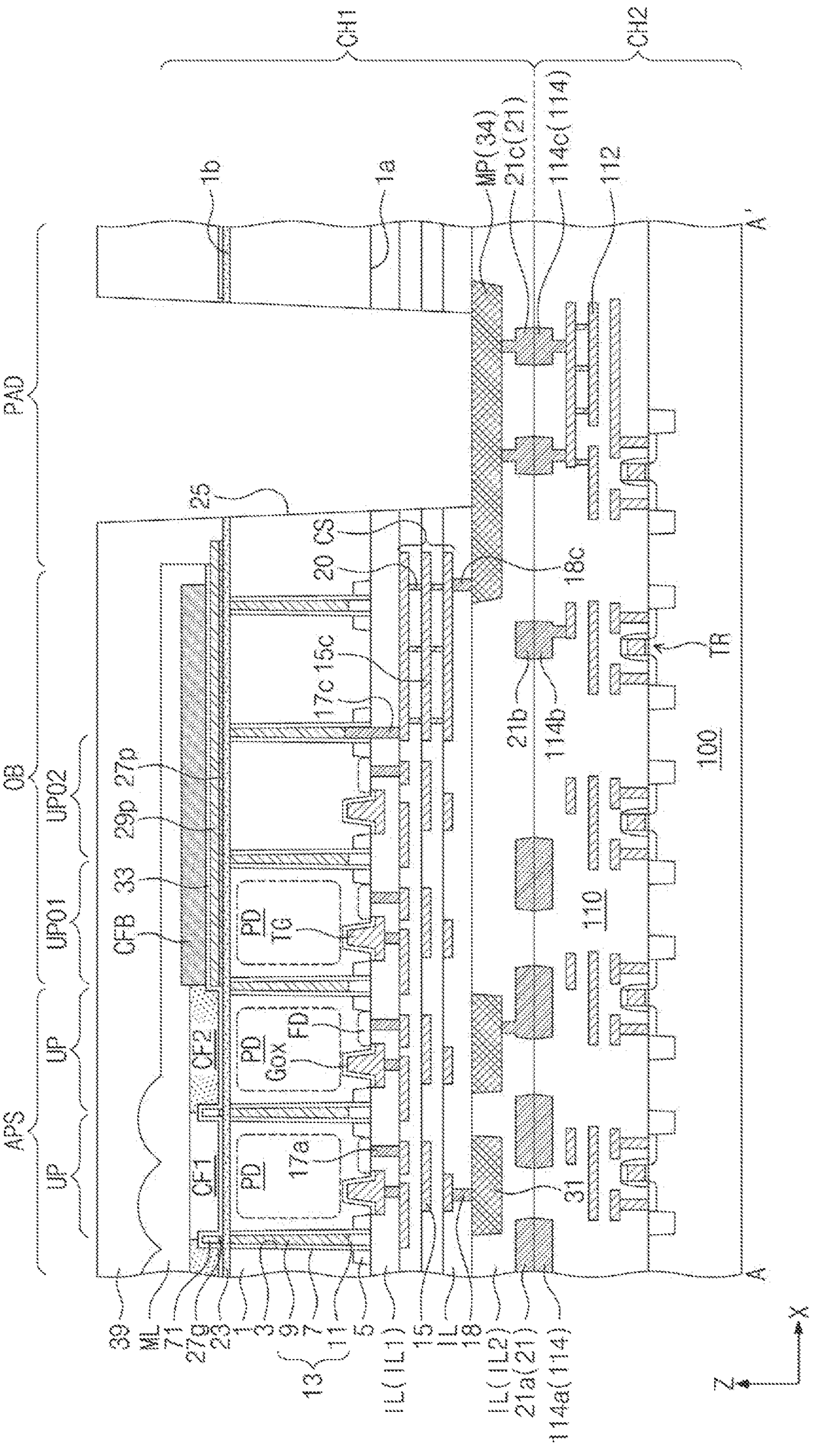

Referring to FIGS. 2 and 19, a recess region 25 exposing the conductive pad 34 may be formed in the pad region PAD. The formation of the recess region 25 may include forming a mask pattern 39, and etching the first substrate 1 and the upper interlayer insulating layer IL by using the mask pattern 39 as an etch mask. The mask pattern 39 may include any one or any combination of a silicon nitride layer, a silicon oxide layer, or a silicon oxynitride layer. Thereafter, the mask pattern 39 may be removed, and thus the image sensor 1000 described with reference to FIG. 3 may be manufactured.

According to the embodiments, the structure capable of applying a voltage to the deep device isolation portion 13 may be relatively easily formed, and thus a process defect may be reduced or minimized. As a result, a manufacturing process may be simplified.

In the image sensor according to the embodiments, the conductive pad and the deep device isolation portion may be electrically connected to each other through the connection wiring structure and the connection contact plug. Thus, an unintended striation defect in the color filters may be reduced or minimized when the color filters are formed. In addition, the connection contact plug may have a high degree of freedom with respect to its formation position, and thus the manufacturing process may be simplified.

While the inventive concepts have been described with reference to the embodiments, it will be apparent to those skilled in the art that various changes and modifications may be made without departing from the spirits and scopes of the inventive concepts. Therefore, it may be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. An image sensor comprising:

a first chip comprising a pixel region, a pad region, and an optical black region interposed between the pixel region and the pad region; and a second chip being in contact with a first surface of the first chip and comprising circuits for driving the first chip, wherein the first chip comprises:

a first substrate;

a device isolation portion disposed in the first substrate and defining unit pixels;

an interlayer insulating layer interposed between the first substrate and the second chip;

a connection wiring structure disposed in the interlayer insulating layer; and a connection contact plug disposed in the interlayer insulating layer and connecting the connection wiring structure to the device isolation portion in the optical black region, and wherein the image sensor further comprises a conductive pad disposed in the first chip or the second chip and being exposed in the pad region by a recess region penetrating the first substrate and the interlayer insulating layer, the conductive pad being electrically connected to the device isolation portion through the connection wiring structure and the connection contact plug.

2. The image sensor of claim 1, wherein the conductive pad is disposed in the interlayer insulating layer of the first chip and is interposed between the connection wiring structure and the second chip.

3. The image sensor of claim 1, wherein the first chip further comprises:

transistors disposed on the first substrate in the pixel region; and first contact plugs connected to the transistors, and wherein the connection contact plug is disposed at substantially a same level as the first contact plugs.

4. The image sensor of claim 3, wherein a bottom surface of the connection contact plug is disposed at substantially a same height as bottom surfaces of the first contact plugs.

5. The image sensor of claim 1, wherein the connection wiring structure is disposed in the optical black region, and wherein the connection contact plug comprises a plurality of connection contact plugs connected in common to the connection wiring structure.

6. The image sensor of claim 5, wherein the connection wiring structure has a ring shape surrounding the pixel region in a plan view.

7. The image sensor of claim 1, wherein the device isolation portion comprises:

a conductive pattern; and an isolation insulating layer surrounding a sidewall of the conductive pattern, wherein the connection contact plug comprises:

an upper portion connected to the conductive pattern; and a lower portion connected to the connection wiring structure, and wherein a width of the lower portion of the connection contact plug is greater than a width of the upper portion of the connection contact plug.

8. The image sensor of claim 1, wherein the first chip further comprises an optical black pattern disposed on a second surface of the first chip, the second surface being opposite to the first surface, and wherein the connection contact plug overlaps with the optical black pattern.

9. The image sensor of claim 1, wherein the first chip further comprises upper connection pads interposed between the conductive pad and the second chip, and wherein the second chip further comprises lower connection pads connected directly to the upper connection pads.

10. The image sensor of claim 9, wherein any one or any combination of the upper connection pads is connected to a bottom surface of the conductive pad through a via.

11. The image sensor of claim 9, wherein the upper connection pads and the lower connection pads comprise a same metal material, and wherein the conductive pad comprises a metal material different from the metal material of the upper connection pads and the lower connection pads.

12. The image sensor of claim 11, wherein the upper connection pads and the lower connection pads comprise copper, and wherein the conductive pad comprises aluminum.

13. The image sensor of claim 1, wherein the device isolation portion comprises:

a deep device isolation portion extending from a first surface of the first substrate toward a second surface of the first substrate, the second surface being opposite to the first surface; and a back device isolation portion extending from the second surface of the first substrate to the deep device isolation portion and defining the unit pixels along with the deep device isolation portion.

14. The image sensor of claim 1, wherein the first chip further comprises a pad contact plug connecting the connection wiring structure to the conductive pad.

15. The image sensor of claim 1, wherein the first chip further comprises metal patterns disposed in the pixel region, and wherein the metal patterns are disposed at substantially a same level as the conductive pad.

16. An image sensor comprising:

a first chip comprising a pixel region, a pad region, and an optical black region interposed between the pixel region and the pad region; and a second chip being in contact with a first surface of the first chip and comprising circuits for driving the first chip, wherein the first chip comprises:

a first substrate;

a device isolation portion disposed in the first substrate and defining unit pixels;

an interlayer insulating layer interposed between the first substrate and the second chip;

a connection wiring structure disposed in the interlayer insulating layer of the optical black region and having a ring shape surrounding the pixel region in a plan view;

connection contact plugs disposed in the interlayer insulating layer and connecting the connection wiring structure to the device isolation portion in the optical black region; and a conductive pad disposed in the interlayer insulating layer and being exposed in the pad region by a recess region penetrating the first substrate, the conductive pad being electrically connected to the device isolation portion through the connection wiring structure and the connection contact plugs, and wherein the connection contact plugs are connected in common to the conductive pad.

17. The image sensor of claim 16, wherein the conductive pad is interposed between the connection wiring structure and the second chip.

18. The image sensor of claim 16, wherein the first chip further comprises:

transistors disposed on the first substrate in the pixel region; and first contact plugs connected to the transistors, and wherein bottom surfaces of the connection contact plugs are disposed at substantially a same height as bottom surfaces of the first contact plugs.

19. An image sensor comprising:

a first chip comprising a pixel region, a pad region, and an optical black region interposed between the pixel region and the pad region; and a second chip being in contact with a first surface of the first chip and comprising circuits for driving the first chip, wherein the first chip comprises:

a first substrate;

a device isolation portion disposed in the first substrate and defining unit pixels;

photoelectric conversion portions disposed in the first substrate in the unit pixels, respectively;

transfer gates disposed on the first substrate;

an upper interlayer insulating layer interposed between the first substrate and the second chip;

first wiring lines disposed in the upper interlayer insulating layer and comprising at least one connection wiring line constituting a connection wiring structure in the optical black region;

a connection contact plug disposed in the upper interlayer insulating layer and connecting the connection wiring structure to the device isolation portion in the optical black region;

upper connection pads exposed by the upper interlayer insulating layer; and metal patterns interposed between the second chip and the first wiring lines and comprising:

a conductive pad disposed in the pad region; and a first metal pattern disposed in the pixel region, wherein the second chip comprises:

a second substrate;

second wiring lines disposed on the second substrate; and lower connection pads connected to the upper connection pads, and wherein the conductive pad is exposed in the pad region by a recess region penetrating the first substrate and the upper interlayer insulating layer, the conductive pad being electrically connected to the device isolation portion through the connection wiring structure and the connection contact plug.

20. The image sensor of claim 19, wherein the first chip further comprises:

transistors disposed on the first substrate in the pixel region; and first contact plugs connected to the transistors, and wherein a bottom surface of the connection contact plug is disposed at substantially a same height as bottom surfaces of the first contact plugs.

* * * * *